(12) United States Patent
Geng et al.

(10) Patent No.: US 11,731,125 B2
(45) Date of Patent: Aug. 22, 2023

(54) PATTERNING METHOD OF FILM, MICROFLUIDIC DEVICE AND MANUFACTURING METHOD THEREOF

(71) Applicants: BEIJING BOE SENSOR TECHNOLOGY CO., LTD., Beijing (CN); BOE TECHNOLOGY GROUP CO., LTD., Beijing (CN)

(72) Inventors: Yue Geng, Beijing (CN); Yuelei Xiao, Beijing (CN); Hui Liao, Beijing (CN); Peizhi Cai, Beijing (CN); Jian Li, Beijing (CN); Shenkang Wu, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 536 days.

(21) Appl. No.: 16/639,867

(22) PCT Filed: Jan. 3, 2019

(86) PCT No.: PCT/CN2019/070242
§ 371 (c)(1),
(2) Date: Feb. 18, 2020

(87) PCT Pub. No.: WO2020/140231
PCT Pub. Date: Jul. 9, 2020

(65) Prior Publication Data
US 2021/0129139 A1 May 6, 2021

(51) Int. Cl.
*B01L 3/00* (2006.01)
*B81C 1/00* (2006.01)

(52) U.S. Cl.
CPC .... *B01L 3/502707* (2013.01); *B81C 1/00071* (2013.01); *B01L 2200/12* (2013.01);
(Continued)

(58) Field of Classification Search
None
See application file for complete search history.

(56) References Cited

U.S. PATENT DOCUMENTS 4,472,240 A * 9/1984 Kameyama ....... H01L 21/76831
257/E21.549
8,263,487 B2   9/2012 Yoon et al.
(Continued)

FOREIGN PATENT DOCUMENTS

CN   104909334 A   9/2015
CN   105384145 A   3/2016
(Continued)

OTHER PUBLICATIONS

First Chinese Office Action from Chinese Patent Application No. 201980000016.3 dated Feb. 24, 2022.

*Primary Examiner* — Roberts P Culbert
(74) *Attorney, Agent, or Firm* — Dilworth & Barrese, LLP.; Michael J. Musella, Esq.

(57) ABSTRACT

A patterning method of a film is disclosed. The method including: providing a film including a first surface; forming n etching barrier layers on the first surface of the film, and n is an integer larger than or equal to 2; and performing n etching processes on the film to form a recessed structure on the first surface using the n etching barrier layers as masks, the recessed structure includes n bottom surfaces respectively having different depths. Two adjacent etching processes of the n etching processes include a previous etching process and a subsequent etching process, and after the previous etching process is completed, a part of the n etching barrier layers is removed to form a mask for the subsequent etching process; a material of the part of the n etching barrier layers which is removed is different from a material of the mask of the subsequent etching process.

14 Claims, 20 Drawing Sheets

(52) U.S. Cl.
CPC ..... *B01L 2300/12* (2013.01); *B01L 2400/086* (2013.01); *B81C 2201/0133* (2013.01)

(56) References Cited

U.S. PATENT DOCUMENTS

2007/0161226 A1\* 7/2007 Dalton .............. H01L 21/76829
438/622
2014/0030885 A1 1/2014 Liu et al.

FOREIGN PATENT DOCUMENTS

| CN | 105428309 A | 3/2016 |
| EP | 2808297 A1 | 5/2014 |
| KR | 102010079947 A | 7/2010 |
| WO | 2015059437 A1 | 12/2014 |

\* cited by examiner

PATTERNING METHOD OF FILM, MICROFLUIDIC DEVICE AND MANUFACTURING METHOD THEREOF

TECHNICAL FIELD

At least one embodiment of the present disclosure relates to a patterning method of a film, a microfluidic device and a manufacturing method thereof.

BACKGROUND

At present, etching methods of a film mainly include a dry etching method and a wet etching method. Both the dry etching method and the wet etching method need to be implemented with a mask. The etching rate of the dry etching method is extremely slow, the production efficiency is low, and the cost is high. The etching rate of the wet etching method is significantly higher than the etching rate of the dry etching method, and a pattern with a size of a hundred micrometers (for example, about 100 μm) can be manufactured on the film. However, a usual manufacturing method of a film can form simple flow channels, grooves and other structures on the film made of some specific materials, but for forming some complex structures such as high-precision structures in a microfluidic device on a film or a substrate made of some materials, such as glass, the usual manufacturing method cannot meet a requirement of production efficiency or accuracy. Generally, these high-precision and complex structures are formed by an injection molding process of polymer materials, and the process has low productivity for mass production, and the size of the molded product changes with the damage of the mold, which has disadvantages in terms of mold cost and stability of product performance. Therefore, for manufacturing these high-precision and complex structures, based on meeting the requirements of accuracy, simplifying the manufacturing process is of great significance to improving the production efficiency.

SUMMARY

At least an embodiment of the present disclosure provides a patterning method of a film, comprising: providing a film comprising a first surface; forming n etching barrier layers on the first surface of the film, and n is an integer larger than or equal to 2; and performing n etching processes on the film to form a recessed structure on the first surface using the n etching barrier layers as masks. The recessed structure comprises n bottom surfaces respectively having different depths, and each of the depths is a distance from a respective bottom surface of the n bottom surfaces to the first surface in a direction perpendicular to the film. Two adjacent etching processes of the n etching processes comprise a previous etching process and a subsequent etching process, and after the previous etching process is completed, a part of the n etching barrier layers is removed to form a mask for the subsequent etching process; and after the previous etching process is completed, a material of the part of the n etching barrier layers which is removed is at least partially different from a material of the mask of the subsequent etching process.

For example, in the patterning method of the film provided by an embodiment of the present disclosure, the n etching barrier layers are stacked in the direction perpendicular to the film.

For example, in the patterning method of the film provided by an embodiment of the present disclosure, the n etching barrier layers comprise two adjacent etching barrier layers, the two adjacent etching barrier layers are stacked and comprise an etching barrier layer close to the film and an etching barrier layer away from the film, an orthographic projection of a part of the etching barrier layer away from the film on the film overlaps with an orthographic projection of the etching barrier layer close to the film on the film, and an orthographic projection of another part of the etching barrier layer away from the film on the film does not overlap with the orthographic projection of the etching barrier layer close to the film on the film; and the part of the n etching barrier layers which is removed after the previous etching process is completed is the etching barrier layer away from the film.

For example, in the patterning method of the film provided by an embodiment of the present disclosure, the etching barrier layer away from the film covers an upper surface, away from the film, of the etching barrier layer close to the film and covers a side surface of the etching barrier layer close to the film, and the side surface intersects with the upper surface.

For example, in the patterning method of the film provided by an embodiment of the present disclosure, the n etching barrier layers comprise two adjacent etching barrier layers, the two adjacent etching barrier layers are stacked and comprise an etching barrier layer close to the film and an etching barrier layer away from the film, an orthographic projection of a part of the etching barrier layer close to the film on the film overlaps with the an orthographic projection of the etching barrier layer away from the film on the film, and an orthographic projection of another part of the etching barrier layer close to the film on the film does not overlap with the orthographic projection of the etching barrier layer away from the film on the film; and the part of the n etching barrier layers which is removed after the previous etching process is completed is the another part of the etching barrier layer close to the film.

For example, in the patterning method of the film provided by an embodiment of the present disclosure, orthographic projections of the n etching barrier layers on the film do not overlap with each other; the n etching barrier layers comprise a previous etching barrier layer and a subsequent etching barrier layer; and the previous etching barrier layer is the part of the n etching barrier layers which is removed after the previous etching process is completed, the subsequent etching barrier layer is the part of the n etching barrier layers which is removed after the subsequent etching process is completed, and a material of the previous etching barrier layer is different from a material of the subsequent etching barrier layer.

For example, in the patterning method of the film provided by an embodiment of the present disclosure, materials of the two adjacent etching barrier layers of the n etching barrier layers are different from each other.

For example, in the patterning method of the film provided by an embodiment of the present disclosure, materials of the n etching barrier layers are all different from each other.

For example, in the patterning method of the film provided by an embodiment of the present disclosure, during the subsequent etching process, the bottom surface formed before the subsequent etching process is further etched.

For example, in the patterning method of the film provided by an embodiment of the present disclosure, a cross-sectional shape of the recessed structure in the direction perpendicular to the film comprises a stepped shape.

For example, in the patterning method of the film provided by an embodiment of the present disclosure, in the n etching processes, the film is etched by a wet etching method.

For example, in the patterning method of the film provided by an embodiment of the present disclosure, a material of each of the n etching barrier layers comprises metal or metal oxide.

For example, in the patterning method of the film provided by an embodiment of the present disclosure, after the previous etching process is completed, a wet etching method is used to remove the part of the n etching barrier layers.

For example, in the patterning method of the film provided by an embodiment of the present disclosure, forming the n etching barrier layers comprises: forming a first etching barrier material layer covering the film on the film, and performing a first patterning process on the first etching barrier material layer to form a first etching barrier layer; . . . ; and forming an nth etching barrier material layer covering an (n−1)th etching barrier layer on a side, away from the film, of the (n−1)th etching barrier layer, and performing an nth patterning process on the nth etching barrier material layer to form an nth etching barrier layer.

For example, in the patterning method of the film provided by an embodiment of the present disclosure, forming each of the n etching barrier layers comprises: forming an etching barrier material layer; forming a photoresist layer on the etching barrier material layer; performing a photolithography process on the etching barrier material layer using the photoresist layer to form the respective etching barrier layer of the n etching barrier layers; and removing the photoresist layer.

For example, the patterning method of the film provided by an embodiment of the present disclosure further comprises: before performing the n etching processes on the film, forming an anti-etching film covering a second surface of the film, and the second surface is opposite to the first surface.

For example, in the patterning method of the film provided by an embodiment of the present disclosure, the film is a glass substrate.

At least an embodiment of the present disclosure further provides a manufacturing method of a microfluidic device, comprising forming a film by the patterning method of the film provided by any one of the embodiments of the present disclosure.

For example, the manufacturing method of the microfluidic device provided by an embodiment of the present disclosure further comprises: providing a first film, the first film comprises a first surface; forming a recessed structure on the first surface of the first film by any one of the patterning methods of the film mentioned above, the recessed structure comprises a first bottom surface having a first depth and a second bottom surface having a second depth, and the second depth is less than the first depth; providing a second film, the second film comprises a protrusion; and bonding the first film and the second film, the first film being opposite to the second film, so that the protrusion is bonded with and in contact with the first bottom surface of the first film to form a cavity between the second bottom surface of the first film and the second film.

At least an embodiment of the present disclosure further provides a microfluidic device, comprising: a first film comprising a first surface, a recessed structure is on the first surface of the first film, the recessed structure comprises a first bottom surface having a first depth and a second bottom surface having a second depth, and the second depth is less than the first depth; and a second film comprising a protrusion, the protrusion is opposite to the first bottom surface of the first film to form a cavity between the second bottom surface of the first film and the second film.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
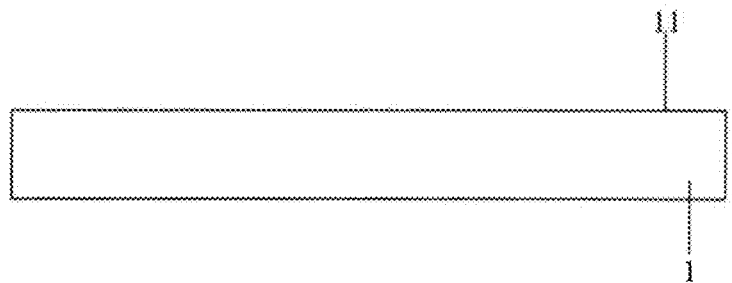
FIG. 1A-FIG. 1M are schematic diagrams of a patterning method of a film provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "Inside," "outside," "on," "under" and the like are only used to indicate relative position relationship, and when the position of the object which is described is changed, the relative position relationship may be changed accordingly.

The drawings used in the present disclosure are not drawn strictly according to actual scale, and the specific size and number of each structure can be determined according to actual needs.

It should be noted that, in the present disclosure, the term "two adjacent etching barrier layers" mean that the two etching barrier layers are adjacent in position. In at least one embodiment, the two adjacent etching barrier layers may be in contact with each other; and in at least one embodiment, the two adjacent etching barrier layers may be spaced apart from each other. In the present disclosure, the term like "an orthographic projection overlaps with another orthographic projection" refers to that shapes of the orthographic projection are same and coincide with each other; and the term like "an orthographic projection does not overlaps with another orthographic projection" refers to that the orthographic projections do not overlap with each other, and there are no overlapping parts. And the term "n etching processes" refers to n times of etching processes.

At least one embodiment of the present disclosure provides a patterning method of a film, and the patterning method including: providing a film including a first surface; forming n etching barrier layers on the first surface of the film, and n is an integer larger than or equal to 2; and performing n etching processes on the film to form a recessed structure on the first surface using the n etching barrier layers as masks, the recessed structure comprises n bottom surfaces respectively having different depths, and each of the depths is a distance from a respective bottom surface of the n bottom surfaces to the first surface in a direction perpendicular to the film. Two adjacent etching processes of the n etching processes comprise a previous etching process and a subsequent etching process, and after the previous etching process is completed, a part of the n etching barrier layers is removed to form a mask for the subsequent etching process; and after the previous etching process is completed, a material of the part of the n etching barrier layers which is removed is at least partially different from a material of the mask of the subsequent etching process. For the production of high-precision and complex structures, the patterning method of the film provided by the embodiment of the present disclosure has a simple process of manufacturing the film and has a high production efficiency while meets the requirement of accuracy. In addition, this method is applicable to wide types of materials of the film.

For example, after the previous etching process is completed, a wet etching method is used to remove the part of the n etching barrier layers. For example, in the process of removing the part of the n etching barrier layers using the wet etching method, etching selectivity of the material of the part which is removed after the previous etching process is completed is different from etching selectivity of a material of a part, which is in contact with an etching solution, of a mask of the subsequent etching process. For example, a ratio of the etching selectivity of the material of the part which is removed after the previous etching process is completed to the etching selectivity of the material of the part, which is in contact with the etching solution, of the mask of the subsequent etching process is larger than or equal to 100, which ensures that in the process of removing the part of the n etching barrier layers using the wet etching method after the previous etching process is completed, the part, which is in contact with the etching solution, of the mask of the subsequent etching process does not react with the etching solution used to dissolve the part which is removed.

For example, in the process of removing the part of the n etching barrier layers using the wet etching method, materials of two adjacent etching barrier layers of the n etching barrier layers are different from each other, which ensures that the etching selectivity of the materials of the two adjacent etching barrier layers in the etching solution used in the process is different. For example, in the etching solution used in the process, a ratio of etching selectivity of a material of the etching barrier layer away from the film of the two adjacent etching barrier layers to etching selectivity of a material of the etching barrier layer close to the film of the two adjacent etching barrier layers is larger than or equal to 100.

For example, the n etching barrier layers include two adjacent etching barrier layers, the two adjacent etching barrier layers are stacked and include an etching barrier layer close to the film and an etching barrier layer away from the film, an orthographic projection of a part of the etching barrier layer away from the film on the film overlaps with the an orthographic projection of the etching barrier layer close to the film on the film, and an orthographic projection of another part of the etching barrier layer away from the film on the film does not overlap with the orthographic projection of the etching barrier layer close to the film on the film; and the part of the n etching barrier layers which is removed after the previous etching process is completed is the etching barrier layer away from the film.

Exemplary, FIG. 1A-FIG. 1M are schematic diagrams of a patterning method of a film provided by an embodiment of the present disclosure. For example, the patterning method of the film provided by an embodiment of the present disclosure includes the steps as illustrated in FIG. 1A-FIG. 1M.

As illustrated in FIG. 1A, the patterning method includes providing a film 1, and the film 1 includes a first surface 11. For example, the film 1 is an inorganic film, and a material of the film 1 is an inorganic material. For example, the inorganic material includes silicon dioxide, such as glass, quartz, and the like. For example, the film 1 is an organic film, and the material of the film 1 is an organic material. For example, the organic material is resin material such as polyethylene (PE), polyvinyl chloride (PVC), polypropylene (PP), and polystyrene (PS), etc. For example, the film 1 is a base substrate that provides support for other structures, such as a glass substrate, a quartz substrate, and the like. It should be noted that, the film in the embodiment of the present disclosure may be any film that needs to be patterned.

The patterning method further includes forming n etching barrier layers on the first surface 11 of the film 1, and n is an integer larger than or equal to 2. For example, forming the n etching barrier layers includes: forming a first etching barrier material layer covering the film 1 on the film 1, and performing a first patterning process on the first etching barrier material layer to form a first etching barrier layer; . . . ; forming an nth etching barrier material layer covering an (n−1)th etching barrier layer on a side, away from the film 1, of the (n−1)th etching barrier layer, and performing an nth patterning process on the nth etching barrier material layer to form an nth etching barrier layer. For example, forming each of the n etching barrier layers includes: forming an etching barrier material layer; forming a photoresist layer on the etching barrier material layer; performing a photolithography process on the etching barrier material layer using the photoresist layer to form the respective etching barrier layer of the n etching barrier layers; and removing the photoresist layer. The embodiment as illustrated in FIG. 1A-FIG. 1M is described by taking a case where n=2 as an example.

Figure 1B:
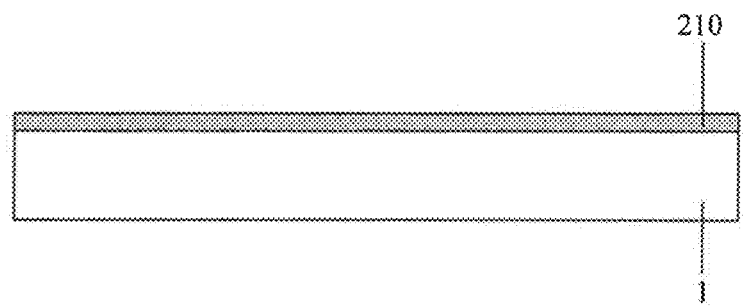

For example, as illustrated in FIG. 1B, a first etching barrier material layer 210 is formed. For example, a material of the first etching barrier material layer 210 includes metal or metal oxide, such as molybdenum, titanium, chromium, or indium tin oxide (ITO), for example, the first etching barrier material layer 210 is formed using a sputtering method.

Figure 1C:
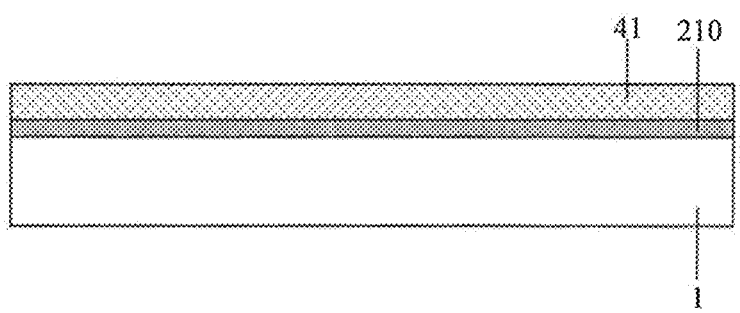

As illustrated in FIG. 1C, a first photoresist layer 41 is formed on the first etching barrier material layer 210. For example, the first photoresist layer 41 is formed by a coating method.

Figure 1D:
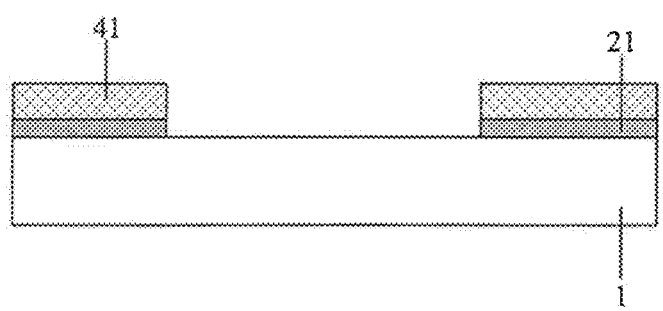

As illustrated in FIG. 1D, a photolithography process is performed on the etching barrier material layer 210 using the first photoresist layer 41 to form a first etching barrier layer 21. An exposure process is performed on the photoresist layer 41 to form a patterned photoresist, and the patterned photoresist is used as a mask to etch the etching barrier material layer to form the etching barrier layer. That is, a first patterning process is performed on the first etching barrier material layer 210 to form the first etching barrier layer 21. The first etching barrier layer 21 exposes a part of the film 1.

Figure 1E:
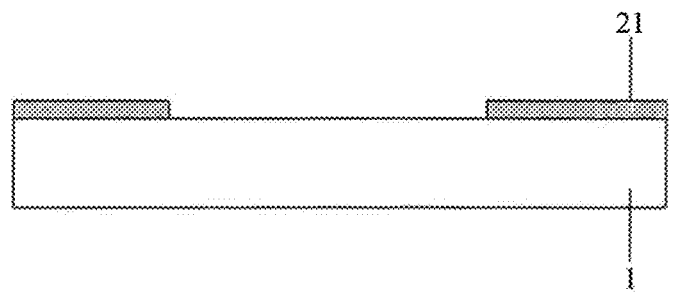

As illustrated in FIG. 1E, the first photoresist layer 41 is removed. For example, the first photoresist layer 41 is peeled.

Figure 1F:
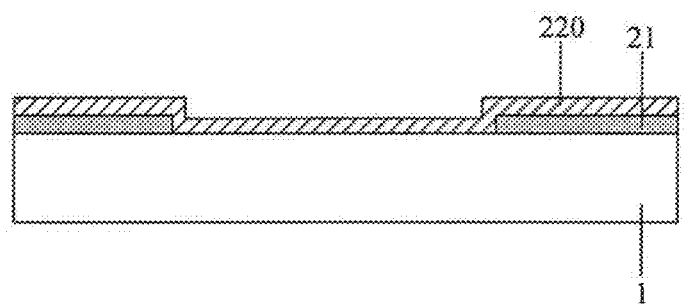

As illustrated in FIG. 1F, a second etching barrier material layer 220 covering the first etching barrier layer 21 is formed on a side of the first etching barrier layer 21 away from the film 1. For example, a material of the second etching barrier material layer 220 includes metal or metal oxide, such as molybdenum, titanium, chromium, or indium tin oxide (ITO). For example, the second etching barrier material layer 220 may be formed by a sputtering method.

Figure 1G:
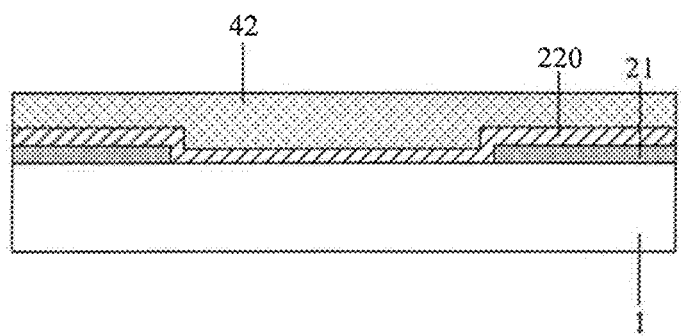

As illustrated in FIG. 1G, a second photoresist layer 42 is formed on the second etching barrier material layer 220. For example, the second photoresist layer 42 is formed by a coating method.

Figure 1H:
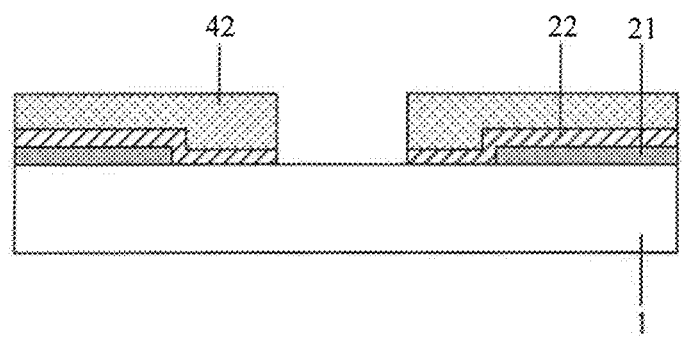

As illustrated in FIG. 1H, a photolithography process is performed on the second etching barrier material layer 220 using the second photoresist layer 42 to form the second etching barrier layer 22, that is, a second patterning process is performed on the second etching barrier material layer 220 to form the second etching barrier layer 22.

Figure 1I:
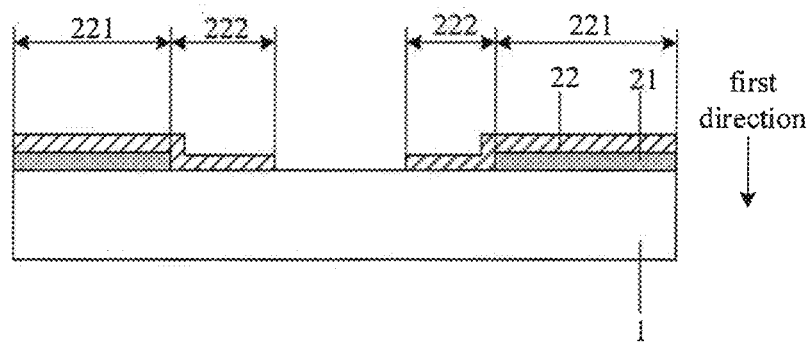

As illustrated in FIG. 1I, the second photoresist layer 42 is removed. For example, the second photoresist layer 42 is peeled.

In the present embodiment, the first etching barrier layer 21 and the second etching barrier layer 22 are stacked in a first direction perpendicular to the film 1. For example, the first etching barrier layer 21 and the second etching barrier layer 22 which are stacked are two adjacent etching barrier layers, and the two adjacent etching barrier layers include an etching barrier layer close to the film 1 (that is, the first etching barrier layer 21) and an etching barrier layer away from the film 1 (that is, the second etching barrier layer 22). An orthographic projection of a part 221 of the etching barrier layer away from the film 1 on the film 1 overlaps with an orthographic projection of the etching barrier layer 21 close to the film 1 on the film 1, and an orthographic projection of another part 222 of the etching barrier layer away from the film 1 on the film 1 does not overlap with the orthographic projection of the etching barrier layer close to the film 1 on the film 1.

Figure 1J:
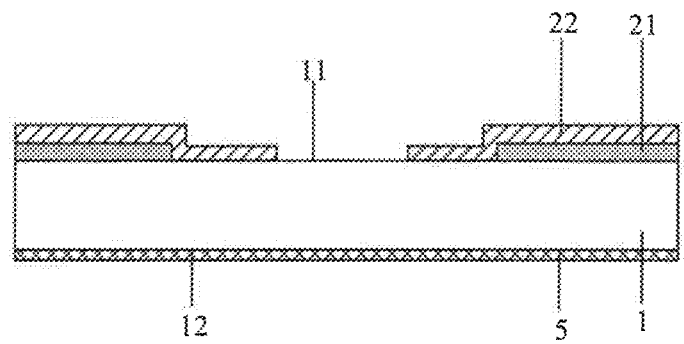

As illustrated in FIG. 1J, an anti-etching film 5 covering a second surface 12 of the film 1 is formed before performing an etching process on the film 1, and the second surface 12 is opposite to the first surface 11. Thus, the second surface 12 of the film 1 that does not need to be etched can be protected, and the second surface 12 can be prevented from being etched in a subsequent etching process.

For example, the patterning method further includes: performing n etching processes on the film to form a recessed structure on the first surface using the n etching barrier layers as masks, the recessed structure includes n bottom surfaces respectively having different depths, and each of the depths is a distance from a respective bottom surface of the n bottom surfaces to the first surface in a direction perpendicular to the film. Two adjacent etching processes of the n etching processes include a previous etching process and a subsequent etching process, and after the previous etching process is completed, a part of the n etching barrier layers is removed to form a mask of the subsequent etching process; and after the previous etching process is completed, a material of the part of the n etching barrier layers which is removed is at least partially different from a material of the mask of the subsequent etching process. Specifically, in FIG. 1A-FIG. 1K, the patterning method includes performing two etching processes on the film to form a recessed structure on the first surface using two etching barrier layers as masks. Two adjacent etching processes include a previous etching process and a subsequent etching process, and after the previous etching process is completed, a part of the two etching barrier layers is removed to form a mask of the subsequent etching process; and after the previous etching process is completed, a material of the part of the two etching barrier layers which is removed is at least partially different from a material of the mask of the subsequent etching process.

Figure 1K:
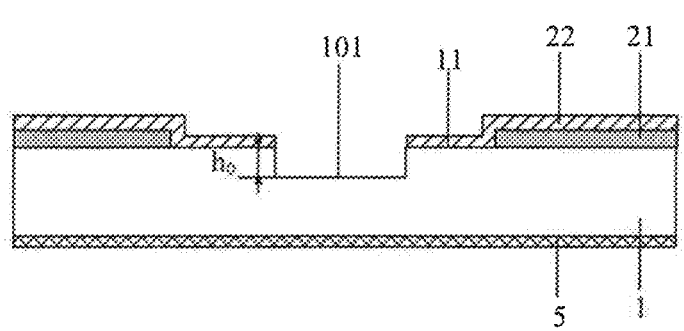

Exemplarily, as illustrated in FIG. 1K, a first etching process is performed on the film 1, using an entirety of the first etching barrier layer 21 and the second etching barrier layer 22 as a mask, to form an initial recessed structure on the first surface 11, and the initial recessed structure includes an initial bottom surface 101 having an initial depth $h_0$. It should be noted that, the depth of the bottom surface in the embodiment of the present disclosure refers to a distance from the bottom surface to the first surface 11 in a direction perpendicular to the film 1.

Figure 1L:
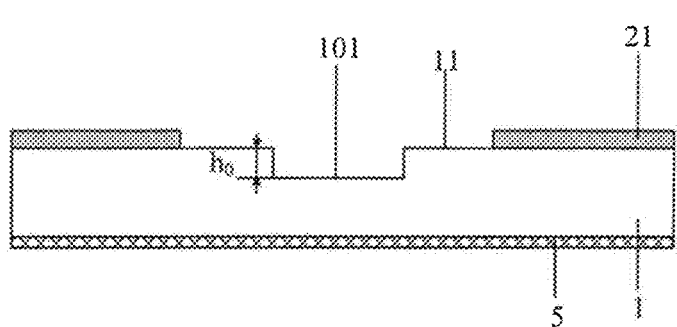

In the present embodiment, the first etching process is the previous etching process, and the second etching process is the subsequent etching process. As illustrated in FIG. 1L, after the first etching process is completed, the etching barrier layer away from the film 1, that is, the second etching barrier layer 22 is removed to form a mask for the second etching process, and the mask for the second etching process is the first etching barrier layer 21. That is, after the previous etching process is completed, the part of the n etching barrier layers which is removed is the etching barrier layer away from the film.

In the present embodiment, a material of the first etching barrier layer and a material of the second etching barrier are different from each other. Therefore, after the previous etching process is completed, a material of the part (the second etching barrier layer 22), which is removed, of the two etching barrier layers and a material of the mask 21 of the subsequent etching process are different from each other.

Figure 1M:
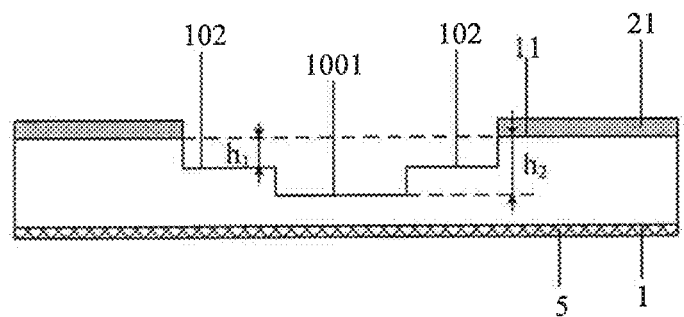

As illustrated in FIG. 1M, the second etching process is performed on the film 1 using the first etching barrier layer 21 as a mask to form a recessed structure on the first surface 11, and the recessed structure includes a first bottom surface

102 having a first depth $h_1$ and a second bottom surface 1001 having a second depth $h_2$. In the second etching process, the depth of the initial bottom surface 101 formed in the first etching process is increased, that is, in the subsequent etching process, the depth of the bottom surface formed before the subsequent etching process is increased, so that $h_2$ is larger than $h_1$.

The first etching barrier layer 21 and the anti-etching film 5 are subsequently removed. For example, in other embodiments, there may be other layer or layers between the anti-etching film 5 and the film 1 which is patterned.

For example, a cross-sectional shape of the recessed structure in the first direction perpendicular to the film includes a stepped shape. For example, in the present embodiment, the cross-sectional shape is symmetrical, and each of two sides of the cross-section have a stepped structure to meet a requirement of specific structural shape.

For example, in the first etching process and the second etching process, the film 1 is etched by a wet etching method. The film 1 is immersed in an etching solution, and the depth of each bottom surface obtained by etching is controlled by controlling the immersion time.

For example, the material of the film 1 includes silicon dioxide. For example, the material of the film 1 is glass. For example, the film 1 is a glass substrate. Generally, the etching time is longer when the film of this material is etched, for example, etching a depth of a hundred micrometers (for example, 100 μm~500 μm) usually requires that the glass substrate is immersed in the etching solution for about ten minutes to an hour. In the patterning method provided by the embodiment of the present disclosure, the etching barrier layer made of metal or metal oxide is not easy to fall off and is not easy to be perforated, and can meet the requirement of the etching process. Of course, the material of the film may be other materials, such as organic materials and other inorganic materials. For details, please refer to the previous description, and details are not described herein again.

For example, in the present embodiment, after the first etching process is completed, the second etching barrier layer 22 is removed by a wet etching method. For example, materials of the two adjacent etching barrier layers are different from each other, that is, the material of the first etching barrier layer 21 is different from a material of the second etching barrier layer 22, so that in the etching solution used in the process of removing the second etching barrier layer 22 by the wet etching method, etching selectivity of the material of the second etching barrier layer 22 is different from etching selectivity of the material of the first etching barrier layer 21, for example, a ratio of the etching selectivity of the material of the second etching barrier layer 22 to the etching selectivity of the material of the first etching barrier layer 21 is larger than or equal to 100. Therefore, in the process of removing the second etching barrier layer using the wet etching method after the first etching process is completed, the first etching barrier layer 21 does not react with the etching solution used to dissolve the second etching barrier layer 22, thereby removing the second etching barrier layer 22 and leaving the first etching barrier layer 21 as the mask for the second etching process.

As described previously, both the material of the first etching barrier layer 21 and the material of the second etching barrier layer 22 may include metal or metal oxide, such as molybdenum, titanium, chromium, indium tin oxide (ITO), and the like. For example, the material of the first etching barrier layer 21 is indium tin oxide (ITO), and the material of the second etching barrier layer 22 is molybdenum. Compared with a case where materials of the two etching barrier layers are other materials such as a photoresist material, in a case where the materials of the two etching barrier layers are metal or metal oxide, during the wet etching process, the first etching barrier layer 21 and the second etching barrier layer 22 are not easy to fall off, the first etching barrier layer 21 and the film 1 are tightly bonded, and the etching accuracy is high. Of course, the material of the first etching barrier layer 21 and the material of the second etching barrier layer 22 are not limited to the types listed above.

Figure 2A:
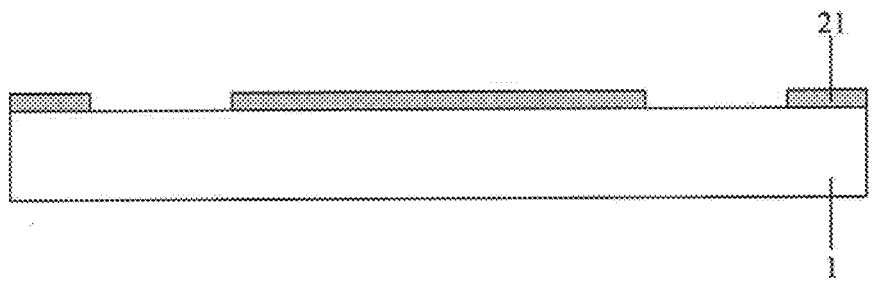
FIG. 2A-FIG. 2I are schematic diagrams of another patterning method of a film provided by an embodiment of the present disclosure.
Figure 2B:
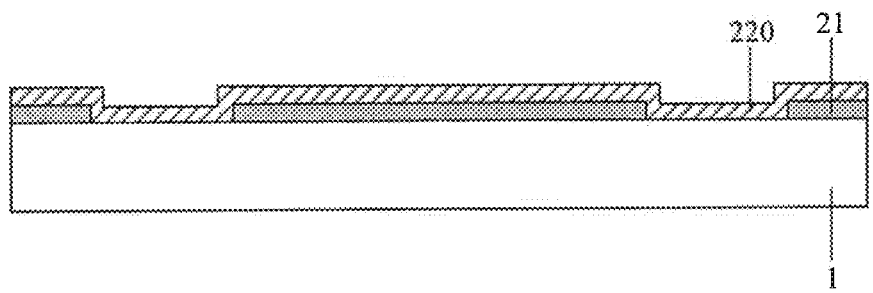
Figure 2C:
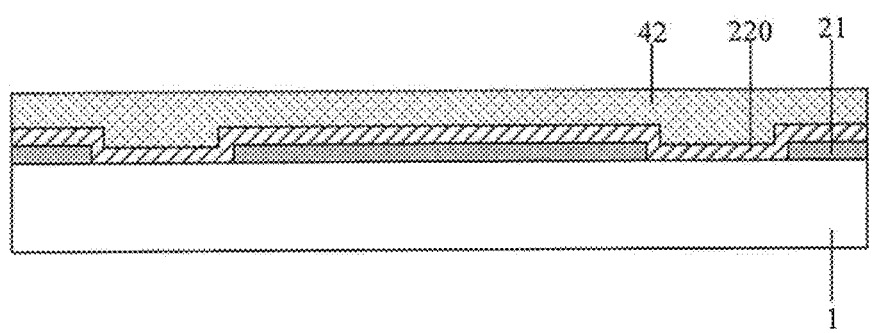
Figure 2D:
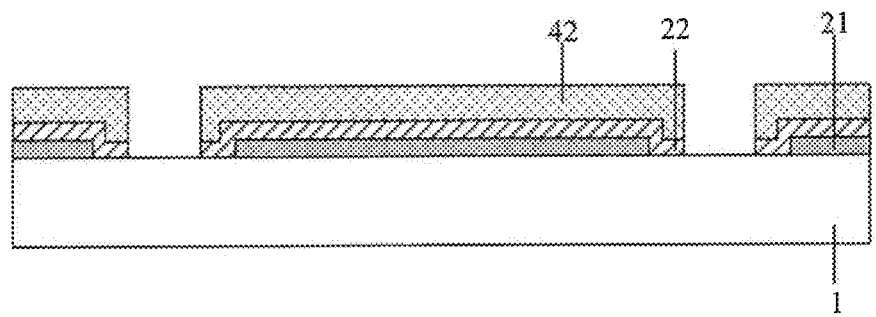
Figure 2E:
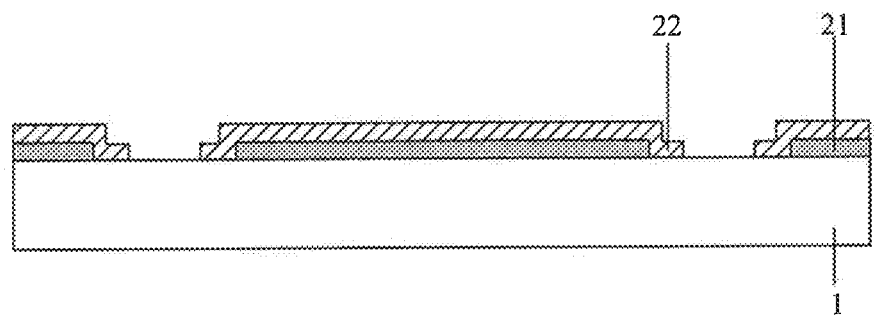
Figure 2F:
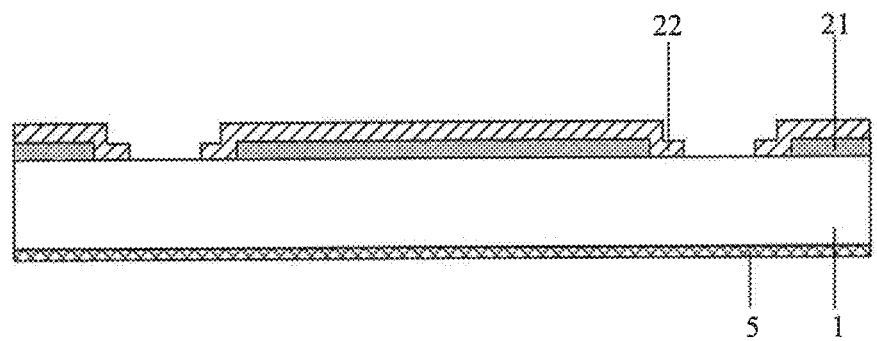
Figure 2G:
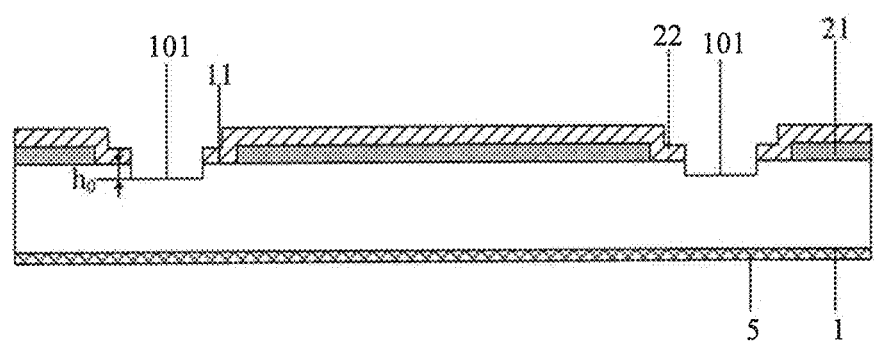
Figure 2H:
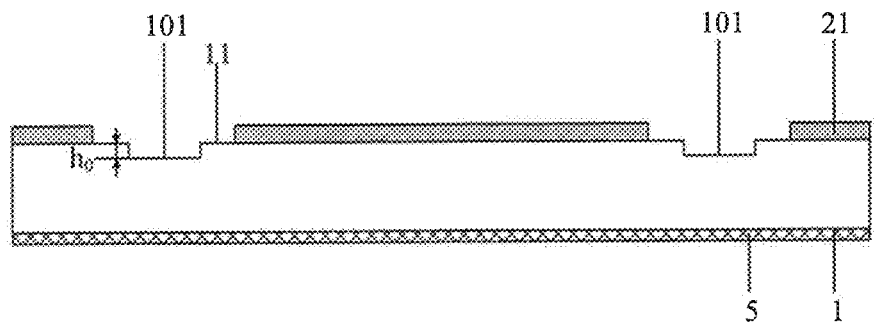
Figure 2I:
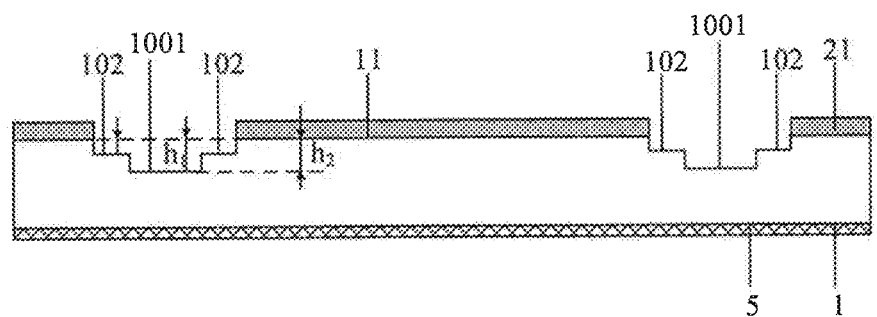

For example, the embodiment as illustrated in FIG. 1A-FIG. 1M takes the formation of one recessed structure on the first surface 11 as an example. In other embodiments of the present disclosure, a plurality of the recessed structures may be formed as required. For example, FIG. 2A-FIG. 2I are schematic diagrams of another patterning method of a film provided by an embodiment of the present disclosure. This embodiment has the following difference from the embodiment as illustrated in FIG. 1A-FIG. 1M. After completing the steps illustrated in FIG. 1A-FIG. 1C, a photolithography process is performed on the first etching barrier material layer to form the first etching barrier layer 21 and a plurality of openings exposing the film 1. Then, the steps illustrated in FIG. 2B-FIG. 2I are performed, which are respectively the same as those illustrated in FIG. 1F-FIG. 1M. Finally, a plurality of the recessed structures illustrated in FIG. 2I are formed simultaneously. Other features and technical effects of this embodiment are the same as those of the embodiment illustrated in FIG. 1A-FIG. 1M, please refer to the previous description.

Figure 3A:
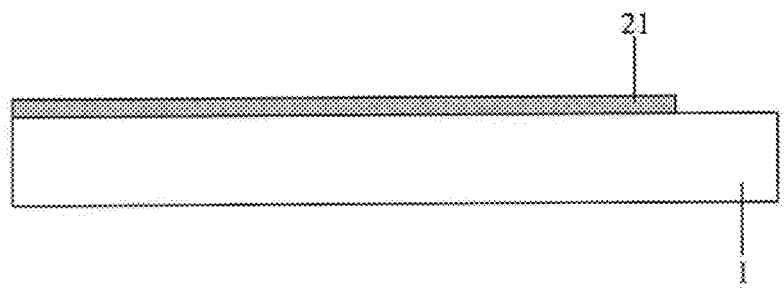
FIG. 3A-FIG. 3I are schematic diagrams of further another patterning method of a film provided by an embodiment of the present disclosure.
Figure 3B:
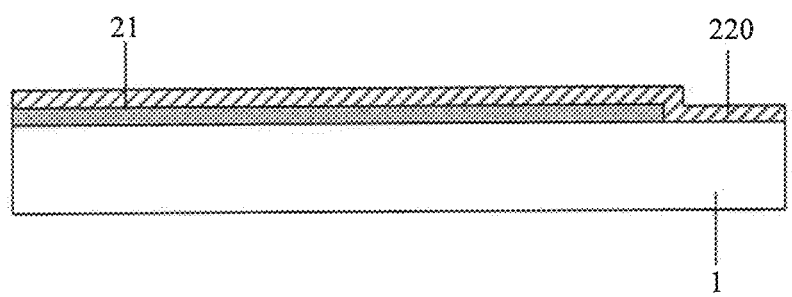
Figure 3C:
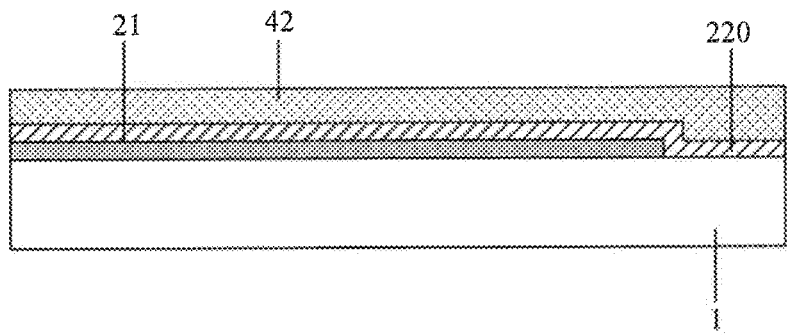
Figure 3D:
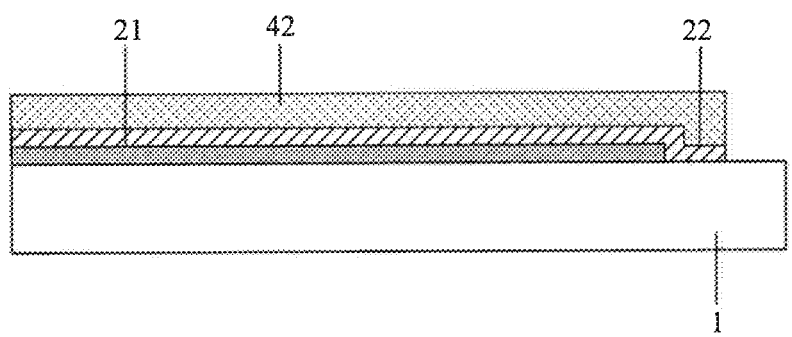
Figure 3E:
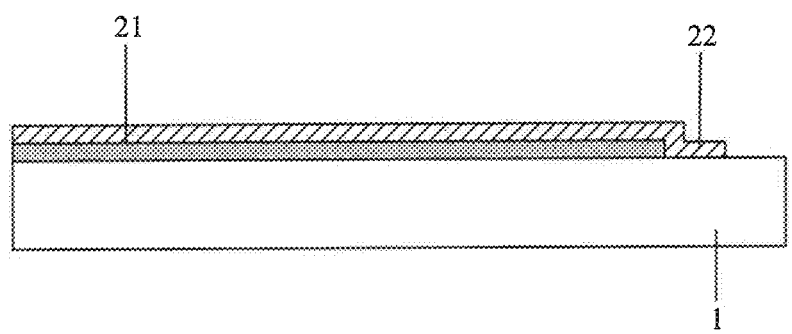
Figure 3F:
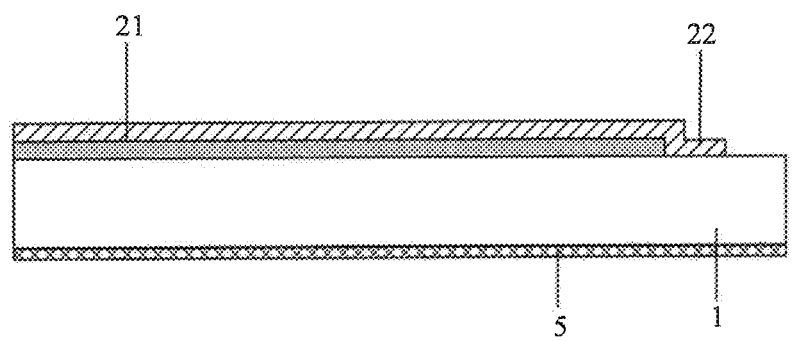
Figure 3G:
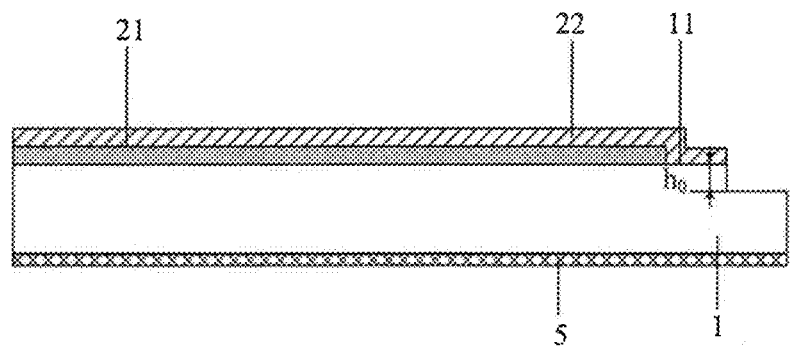
Figure 3H:
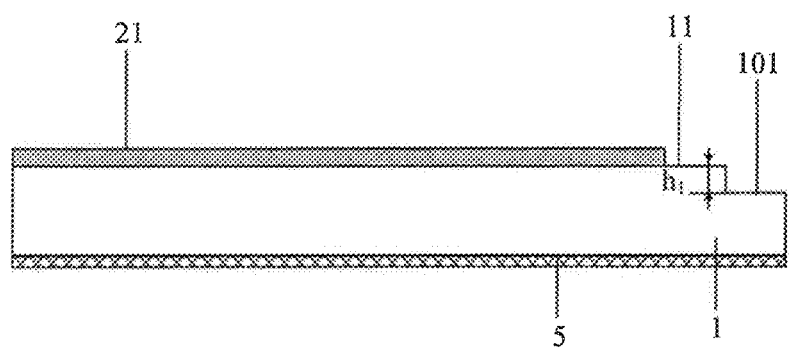
Figure 3I:
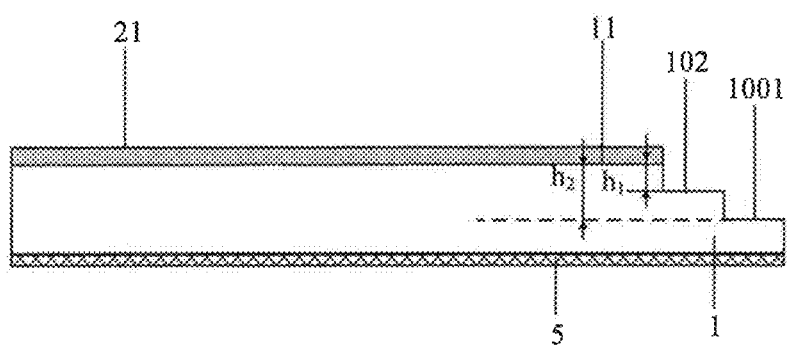

FIG. 3A-FIG. 3I are schematic diagrams of further another patterning method of a film provided by an embodiment of the present disclosure. This embodiment has the following difference from the embodiment illustrated in FIG. 1A-FIG. 1M. After completing the steps illustrated in FIG. 1A-FIG. 1C, a photolithography process is performed on the first etching barrier material layer to form the first etching barrier layer 21 and an opening exposing the film 1, and the opening is located at an edge of the film 1. Thus, then, after performing the steps illustrated in FIG. 3B-FIG. 3I, a recessed structure illustrated in FIG. 3I is obtained. In a cross-section of the recessed structure along the first direction, only one side of the cross-section has the stepped shape so as to meet the requirement of the recessed structure with a specific shape. The steps illustrated in FIG. 3B-FIG. 3I are the same as those as illustrated in FIG. 1F-FIG. 1M. Other features and technical effects of this embodiment are the same as those of the embodiment illustrated in FIG. 1A-FIG. 1M, please refer to the previous description.

FIG. 4A-FIG. 4J are schematic diagrams of further still another patterning method of a film provided by an embodiment of the present disclosure. In the present embodiment, a patterning method of a film is described by taking a case where n=3 as an example. This embodiment has the following difference from the embodiment illustrated in FIG. 1A-FIG. 1M. After completing the steps illustrated in FIG. 1A-FIG. 1I, the steps illustrated in FIG. 4A-FIG. 4J are performed.

Figure 4A:
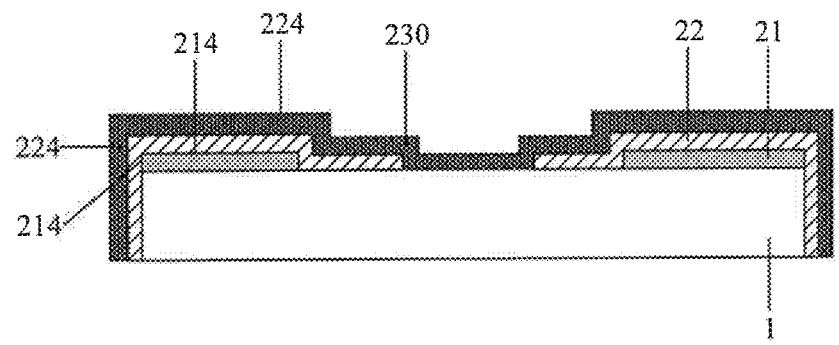
FIG. 4A-FIG. 4J are schematic diagrams of further another patterning method of a film provided by an embodiment of the present disclosure.

As illustrated in FIG. 4A, a third etching barrier material layer 230 covering the second etching barrier layer 22 is formed on a side, away from the film 1, of the first etching barrier layer 21. For example, the third etching barrier material layer 230 is formed by a sputtering method.

Figure 4B:
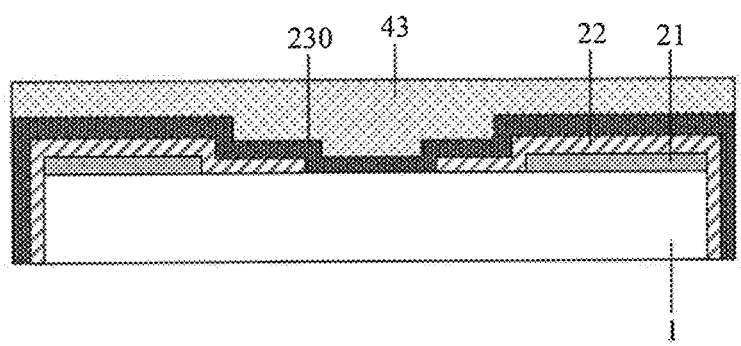

As illustrated in FIG. 4B, a third photoresist layer 43 is formed on the third etching barrier material layer 230. For example, the third photoresist layer 43 is formed by a coating method.

Figure 4C:
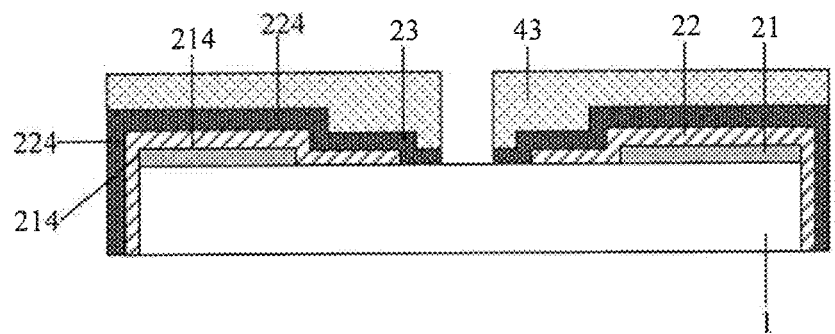

As illustrated in FIG. 4C, is used to a photolithography process is performed on the third etching barrier material layer 230 using the third photoresist layer 43 to form a third etching barrier layer 23, that is, a third patterning process is performed on the third etching barrier material layer 230 to form the third etching barrier layer 23.

Figure 4D:
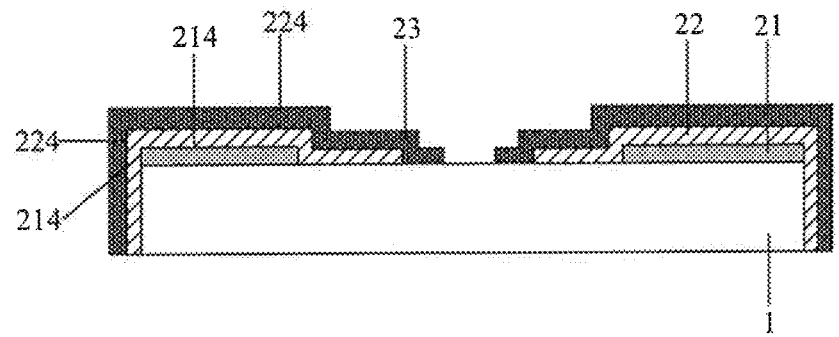

As illustrated in FIG. 4D, the third photoresist layer 43 is removed. For example, the third photoresist layer 43 is peeled.

For example, in the present embodiment, three etching barrier layers are formed on the film 1, namely the first etching barrier layer 21, the second etching barrier layer 22 and the third etching barrier layer 23, and the three etching barrier layers are stacked in the first direction perpendicular to the film 1. For example, the first etching barrier layer 21 and the second etching barrier layer 22 are two adjacent etching barrier layers, and the two adjacent etching barrier layers include the etching barrier layer 21 close to the film 1 and the etching barrier layer 22 away from the film 1. An orthographic projection of a part 221 of the etching barrier layer 22 away from the film 1 on the film 1 overlaps with an orthographic projection of the etching barrier layer 21 close to the film 1 on the film 1, and an orthographic projection of another part 222 of the etching barrier layer 22 away from the film 1 on the film 1 does not overlap with the orthographic projection of the etching barrier layer 21 close to the film 1 on the film 1. The second etching barrier layer 22 and the third etching barrier layer 23 are two adjacent etching barrier layers, and the two adjacent etching barrier layers include the etching barrier layer 22 close to the film 1 and the etching barrier layer 23 away from the film 1. An orthographic projection of a part 231 of the etching barrier layer 23 away from the film 1 on the film 1 overlaps with an orthographic projection of the etching barrier layer 22 close to the film 1 on the film 1, and an orthographic projection of another part 232 of the etching barrier layer 23 away from the film 1 on the film 1 does not overlap with the orthographic projection of the etching barrier layer 21 close to the film 1 on the film 1.

Figure 4E:
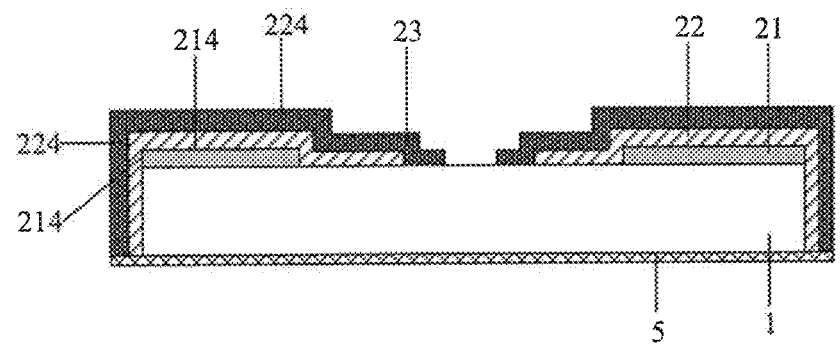

As illustrated in FIG. 4E, before the film 1 is etched, an anti-etching film 5 covering the second surface 12 of the film 1 is formed, and the second surface 12 is opposite to the first surface 11. In this way, the second surface 12 of the film 1 that does not need to be etched can be protected, and the second surface 12 can be prevented from being etched in the subsequent etching process.

For example, the patterning method further includes: performing n etching processes on the film to form a recessed structure on the first surface using the n etching barrier layers as masks, the recessed structure includes n bottom surfaces respectively having different depths, and each of the depths is a distance from a respective bottom surface of the n bottom surfaces to the first surface in a direction perpendicular to the film. Two adjacent etching processes of the n etching processes include a previous etching process and a subsequent etching process, and after the previous etching process is completed, a part of the n etching barrier layers is removed to form a mask of the subsequent etching process; and after the previous etching process is completed, a material of the part of the n etching barrier layers which is removed is at least partially different from a material of the mask of the subsequent etching process. Specifically, in FIG. 4A-FIG. 4J, the patterning method includes: performing three etching processes on the film to form a recessed structure on the first surface using the three etching barrier layers as masks, the recessed structure includes three bottom surfaces respectively having different depths. Two adjacent etching processes include a previous etching process and a subsequent etching process, and after the previous etching process is completed, a part of the three etching barrier layers is removed to form a mask for the subsequent etching process; and after the previous etching process is completed, a material of the part of the three etching barrier layers which is removed is at least partially different from a material of the mask of the subsequent etching process.

Figure 4F:
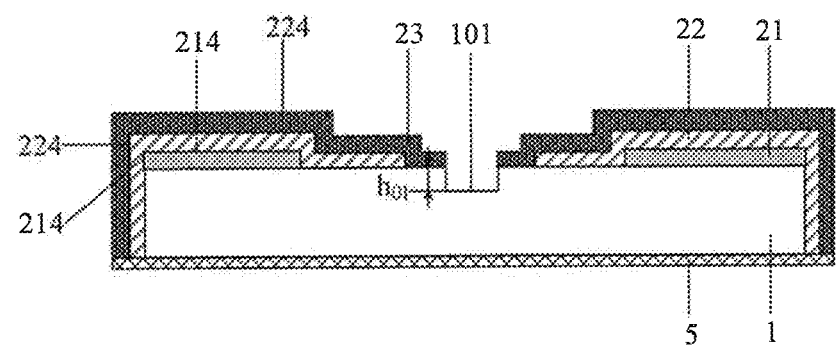

Exemplarily, as illustrated in FIG. 4F, a first etching process is performed, using the three etching barrier layers as masks, on the film 1 to form a first initial recessed structure on the first surface 11, and the first initial recessed structure includes a first initial bottom surface 101 having a first initial depth $h_{01}$.

Figure 4G:
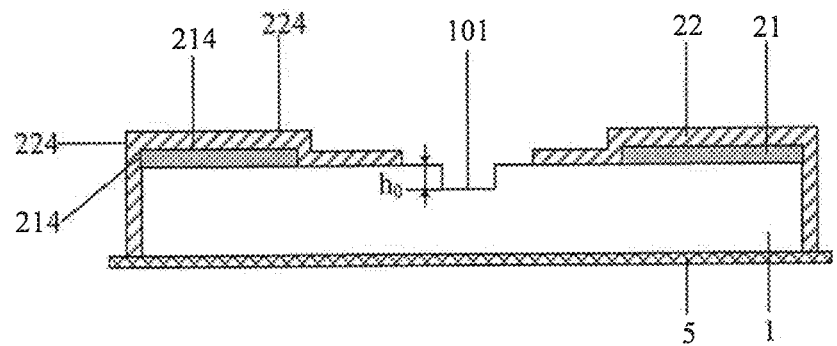

As illustrated in FIG. 4G, after the first etching process is completed, the third etching barrier layer 23 is removed to form a mask for a second etching process, and the mask for the second etching process is formed by the first etching barrier layer 21 and the second etching barrier layer. During the first etching process and the second etching process, the first etching process is the previous etching process of the two adjacent etching processes, and the second etching process is the subsequent etching process of the two adjacent etching processes.

Figure 4H:
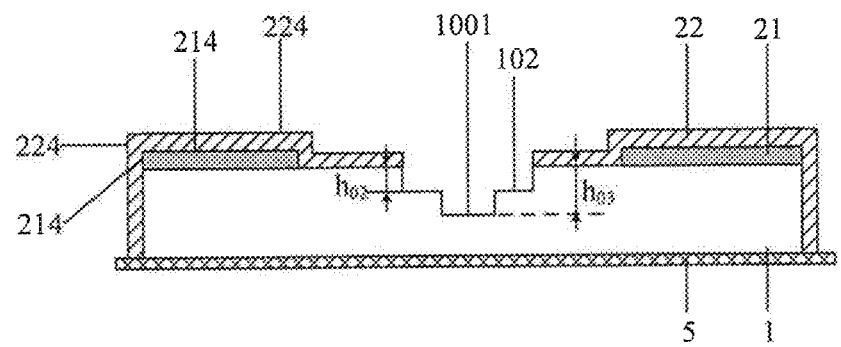

As illustrated in FIG. 4H, an entirety of the first etching barrier layer 21 and the second etching barrier layer 22 is used as a mask to perform the second etching process on the film 1 to form a second initial recessed structure on the first surface 11; the second initial recessed structure includes a second initial bottom surface 102 having a second initial depth $h_{02}$ and a third initial bottom surface 1001 having a third initial depth $h_{03}$. In the second etching process, the depth of the first initial bottom surface 101 formed in the first etching process is increased, so that $h_{03}$ is larger than hoe.

Figure 4I:
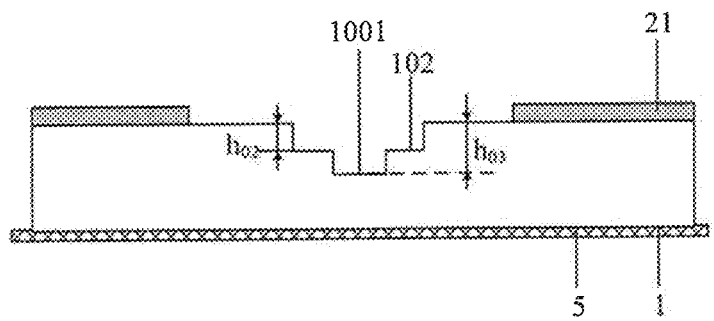

As illustrated in FIG. 4I, after the second etching process is completed, the second etching barrier layer 22 is removed to form a mask for a third etching process, and the mask is the first etching barrier layer 21. During the second etching process and the third etching process, the second etching process is the previous etching process in the two adjacent etching processes, and the third etching process is the subsequent etching process of the two adjacent etching processes.

In the present embodiment, for example, a material of the third etching barrier layer 23, a material of the second etching barrier layer 22, and a material of the first etching barrier layer 21 are all different from each other, that is, after the first etching process is completed, a material of a part (that is, the third etching barrier layer 23), which is removed, of the three etching barrier layers is different from a material of the mask for the second etching process. For example, in an etching solution used in the process of removing the third etching barrier layer 23 by a wet etching method, etching selectivity of the material of the third etching barrier layer 23, etching selectivity of the material of the second etching barrier layer 22, and etching selectivity of the material of the first etching barrier layer 21 are all different from each other, so as to remove the third etching barrier layer 23 and retain the second etching barrier layer 22 and the first etching barrier layer 21 to prevent excessive etching; in an etching solution used in the process of removing the second etching barrier layer 22 by a wet etching method, etching selectivity of the material of the second etching barrier layer 22, and etching selectivity of the material of the first etching barrier layer 21 are different from each other, so as to remove the second etching barrier layer 22 and retain the first etching barrier layer 21 to prevent excessive etching.

Figure 4J:
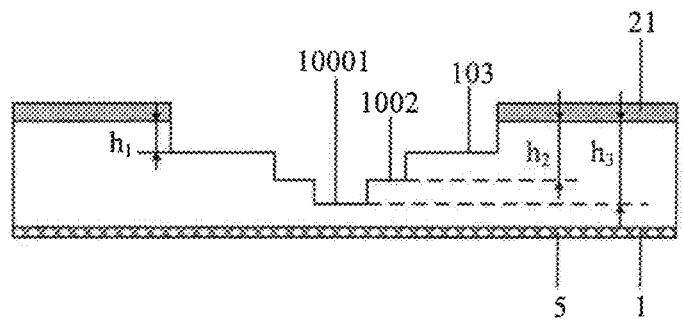

As illustrated in FIG. 4J, the first etching barrier layer 21 is used as the mask for performing the third etching process on the film 1 to form the recessed structure on the first surface 11, and the recessed structure includes a first bottom surface 103 having a first depth $h_1$, a second bottom surface 1002 having a second depth $h_2$ and a third bottom surface 10001 having a third depth $h_3$. During the third etching process, the depth of the third initial bottom surface 1001 and the depth of the second initial bottom surface 102 formed in the second etching process are both increased, that is, in the subsequent etching process, the depths of the bottom surfaces formed before the subsequent etching process are all increased. Therefore, $h_3 > h_2 > h_1$.

For example, during the first etching process, the second etching process and the third etching process, the film 1 is etched by a wet etching method. The film 1 is immersed in an etching solution, and the depth of each bottom surface obtained by etching is controlled by controlling the immersion time.

For example, the part of the n etching barrier layers is removed using a wet etching method. During the wet etching process, materials of the two adjacent etching barrier layers of the n etching barrier layers are different from each other, which ensures that the etching selectivity of the materials of the two adjacent etching barrier layers in the etching solution used in the process is different. For example, in the etching solution used in the process, a ratio of etching selectivity of a material of the etching barrier layer away from the film of the two adjacent etching barrier layers to etching selectivity of a material of the etching barrier layer close to the film of the two adjacent etching barrier layers is larger than or equal to 100.

For example, in the present embodiment, after the previous etching process is completed, the part of the three etching barrier layers is removed using a wet etching method. After the first etching process of the film 1 is completed, the third etching barrier layer 23 is removed by a wet etching method; and after the second etching process is completed, the second etching barrier layer 22 is removed by a wet etching method. For example, materials of the two adjacent etching barrier layers are different from each other, that is, the material of the first etching barrier layer 21 and the material of the second etching barrier layer 22 are different, and the material of the second etching barrier layer 22 and the material of the third etching barrier layer 23 are different, so that in the etching solution used in the process of removing the second etching barrier layer 22 by a wet etching method, etching selectivity of the material of the second etching barrier layer 22 is different from etching selectivity of the material of the first etching barrier layer 21, for example, a ratio of the etching selectivity of the material of the second etching barrier layer 22 to the etching selectivity of the material of the first etching barrier layer 21 is larger than or equal to 100, and a ratio of the etching selectivity of the material of the third etching barrier layer 23 to the etching selectivity of the material of the second etching barrier layer 22 is larger than or equal to 100. Therefore, in the process of removing the third etching barrier layer 23 using a wet etching method after the first etching process is completed, the second etching barrier layer 22 almost does not react with the etching solution used to dissolve the third etching barrier layer 23, thereby removing the third etching barrier layer 23 and leaving the second etching barrier layer 22 and the first etching barrier layer 21 as the mask for the second etching process; and in the process of removing the second etching barrier layer 22 using a wet etching method after the second etching process is completed, the first etching barrier layer 21 almost does not react with the etching solution used to dissolve the second etching barrier layer 22, thereby removing the second etching barrier layer 22 and leaving the first etching barrier layer 21 as the mask for the third etching process.

For example, the material of the first etching barrier layer 21, the material of the second etching barrier layer 22, and the material of the third etching barrier layer 23 may all include metal or metal oxide, such as molybdenum, titanium, chromium, indium tin oxide (ITO), and the like.

For example, the material of the first etching barrier layer 21, the material of the second etching barrier layer 22, and the material of the third etching barrier layer 23 are all different from each other. For example, the material of the first etching barrier layer 21 is indium tin oxide (ITO), the material of the second etching barrier layer 22 is molybdenum, and the material of the third etching barrier layer 23 is chromium.

For example, materials of the two adjacent etching barrier layers of the n etching barrier layers are different from each other, and materials of the etching barrier layers, which are not adjacent to each other, of the n etching barrier layers, are same, so as to reduce the limitation of types of the materials, reduce the types of materials of the etching barrier layers formed, and simplify the production process. For example, the material of the first etching barrier layer 21 is different from the material of the second etching barrier layer 22, the material of the second etching barrier layer 22 is different from the material of the third etching barrier layer 23, and the material of the first etching barrier layer 21 is the same as the material of the third etching barrier layer 23. For example, the material of the first etching barrier layer 21 is indium tin oxide (ITO), the material of the second etching barrier layer 22 is molybdenum, and the material of the third etching barrier layer is indium tin oxide (ITO).

For example, the etching barrier layer away from the film 1 covers an upper surface, away from the film 1, of the etching barrier layer close to the film 1 and covers a side surface of the etching barrier layer close to the film 1, and the side surface intersects with the upper surface to protect the side surface of the etching barrier layer close to the film 1, and prevent the side surface of the etching barrier layer from reacting with an etching solution which is used to etch the etching barrier layer away from the film 1, so as to cause the etching barrier layer close to the film 1 to be corroded, thereby achieving a greater etching accuracy of the film 1 and meeting the requirement of high precision. For example, in the embodiment illustrated in FIG. 4A-FIG. 4J, the third etching barrier layer 23 covers an upper surface 223, away from the film 1, of the second etching barrier layer and a side surface 224 of the second etching barrier layer; and the second etching barrier layers 22 covers an upper surface 213, away from the film 1, of the first etching barrier layer and a side surface 214 of the first etching barrier layer.

Other features and technical effects of the embodiment as illustrated in FIG. 4A-FIG. 4J are the same as those of the previous embodiment, please refer to the previous description.

FIG. 5A-FIG. 5I are schematic diagrams of further another patterning method of a film provided by an embodiment of the present disclosure. This embodiment has the following difference from the embodiment illustrated in FIG. 1A-FIG. 1M. The n etching barrier layers include two adjacent etching barrier layers, the two adjacent etching barrier layers are stacked and include an etching barrier layer close to the film and an etching barrier layer away from the film, an orthographic projection of a part of the etching barrier layer close to the film on the film overlaps with an orthographic projection of the etching barrier layer away from the film on the film, and an orthographic projection of another part of the etching barrier layer close to the film on the film does not overlap with the orthographic projection of the etching barrier layer away from the film on the film; and the part of the n etching barrier layers which is removed after the previous etching process is completed is the another part of the etching barrier layer close to the film. In the present embodiment, the patterning method of a film is described by taking a case where n=2 as an example.

Exemplarily, after the steps illustrated in FIG. 1A-FIG. 1C are completed, the steps illustrated in FIG. 5A-FIG. 5I are performed.

Figure 5A:
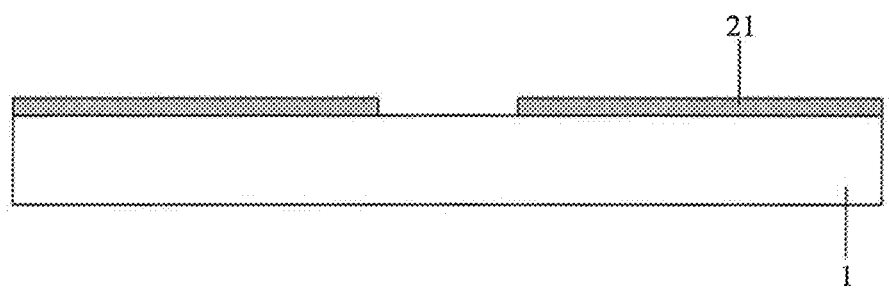
FIG. 5A-FIG. 5I are schematic diagrams of further another patterning method of a film provided by an embodiment of the present disclosure.

As illustrated in FIG. 5A, a first patterning process is performed on the first etching barrier material layer 210 using the first photoresist layer 41 (as illustrated in FIG. 1C) to form a first etching barrier layer 21, and the first photoresist layer 41 is removed. The first etching barrier layer 21 exposes a part of the film 1.

Figure 5B:
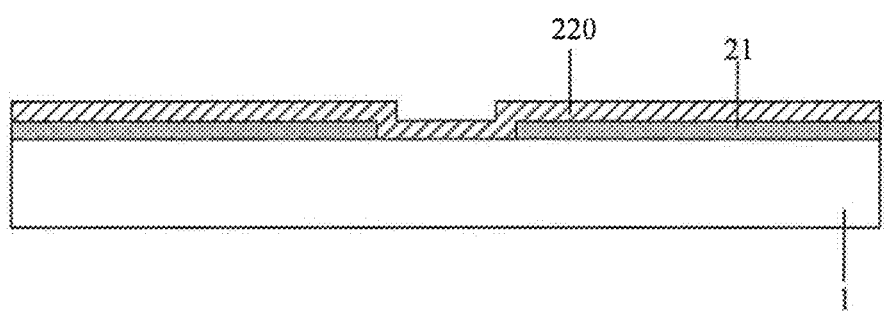

As illustrated in FIG. 5B, a second etching barrier material layer 220 covering the first etching barrier layer 21 is formed on a side, away from the film 1, of the first etching barrier layer 21.

Figure 5C:
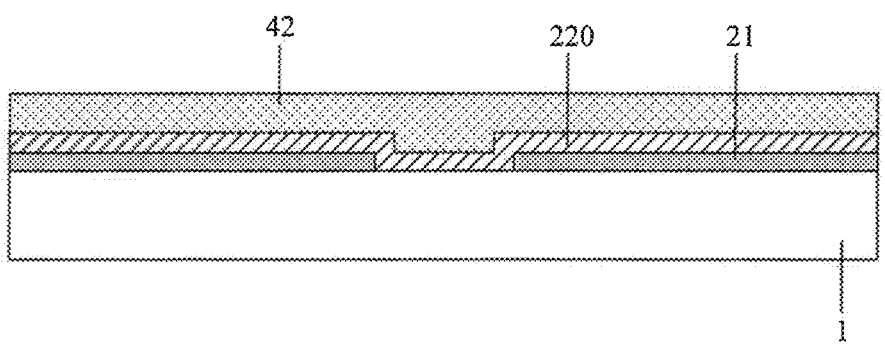

As illustrated in FIG. 5C, a second photoresist layer 42 is formed on the second etching barrier material layer 220. For example, the second photoresist layer 42 is formed by a coating method.

Figure 5D:
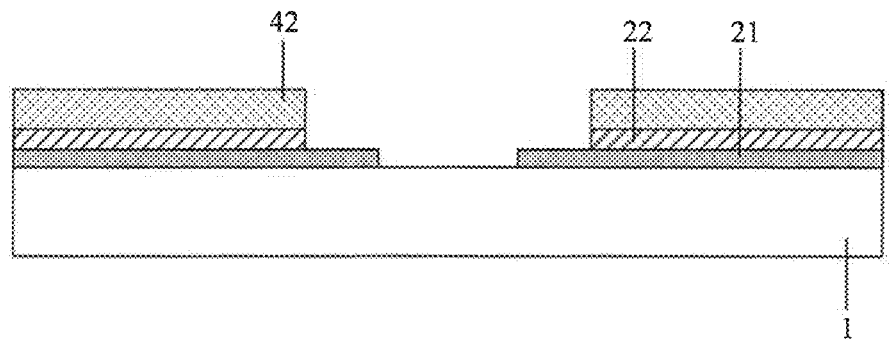

As illustrated in FIG. 5D, a photolithography process is performed on the second etching barrier material layer 220 using the second photoresist layer 42 to form the second etching barrier layer 22.

Figure 5E:
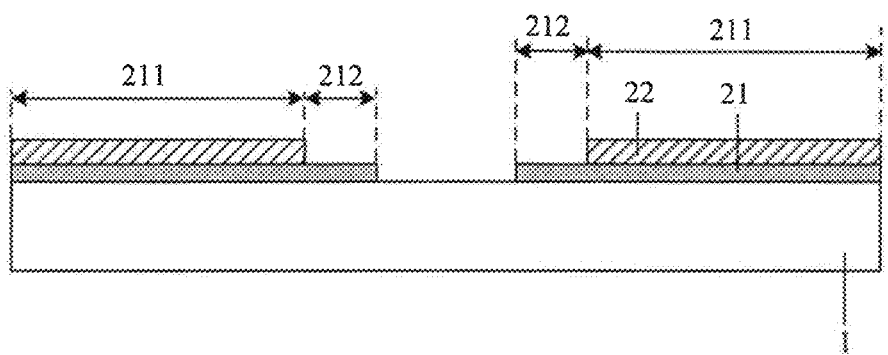

As illustrated in FIG. 5E, the second photoresist layer 42 is removed.

In the present embodiment, the first etching barrier layer 21 and the second etching barrier layer 22 are stacked in the first direction. The first etching barrier layer 21 and the second etching barrier layer 22 are two adjacent etching barrier layers, in the two etching barrier layers, the first etching barrier layer 21 is an etching barrier layer close to the film 1, and the second etching barrier layer 22 is an etching barrier layer away from the film 1. An orthographic projection of a part 211 of the first etching barrier layer 21 on the film 1 overlaps with an orthographic projection of the second etching barrier layer 22 on the film 1, and an orthographic projection of another part 212 of the first etching barrier layer 21 on the film 1 does not overlap with the orthographic projection of the second etching barrier layer 22 on the film 1.

Figure 5F:
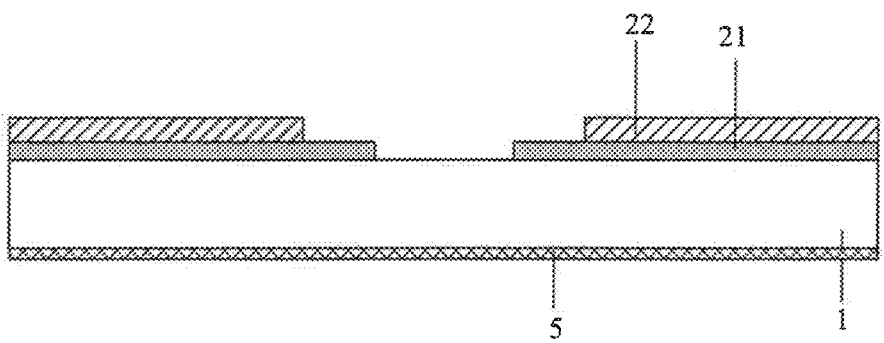

As illustrated in FIG. 5F, an anti-etching film 5 covering the second surface 12 of the film 1 is formed before performing an etching process on the film 1, and the second surface 12 is opposite to the first surface 11. Thus, the second surface 12 of the film 1 that does not need to be etched can be protected, and the second surface 12 can be prevented from being etched in the subsequent etching process.

Figure 5G:
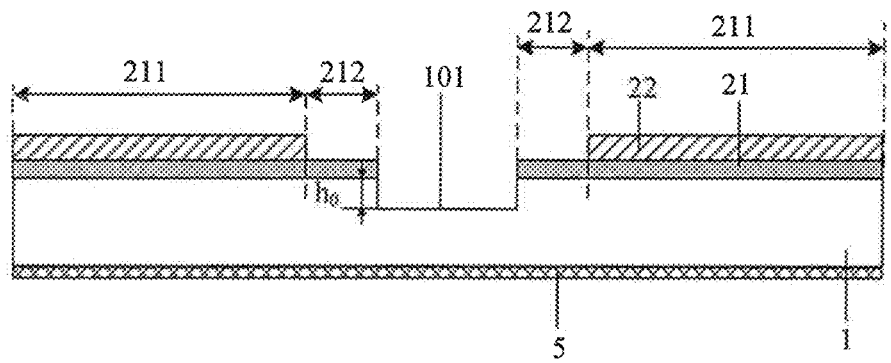

As illustrated in FIG. 5G, a first etching process is performed on the film 1, using a group consisting of an entirety of the first etching barrier layer 21 and an entirety of the second etching barrier layer 22 as a mask, to form an initial recessed structure on the first surface 11, and the initial recessed structure includes an initial bottom surface 101 having an initial depth $h_0$.

Figure 5H:
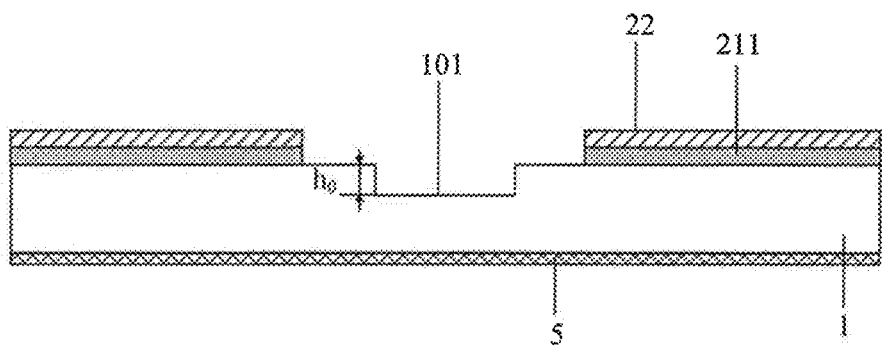

As illustrated in FIG. 5H, after the first etching process is completed, a part of the two etching barrier layers is removed to form a mask for a second etching process. The part which is removed of the two etching barrier layers is another part 212 of the first etching barrier layer 21 (that is, the etching barrier layer close to the film), therefore, an entirety consisting of the second etching barrier layer 22 and the part 211 of the first etching barrier layer 21 is the mask for the second etching process (that is, the subsequent etching process of the two adjacent etching processes). For example, the another part 212 of the first etching barrier layer 21 is removed by a wet etching method. For example, a material of the first etching barrier layer 21 is different from a material of the second etching barrier layer 22, so that the material of the another part 212 which is removed of the first etching barrier layer 21 is different from the material of a part of the mask of the second etching process. For example, in the etching solution used in the process of removing the another part 212 of the first etching barrier layer 21 by a wet etching method, etching selectivity of the material of the first etching barrier layer 21 is different from etching selectivity of the material of the second etching barrier layer 22, for example, a ratio of the etching selectivity of the material of the first etching barrier layer 21 to the etching selectivity of the material of the second etching barrier layer 22 is larger than or equal to 100. Thus, the another part 212 of the first etching barrier layer 21 is exposed to the etching solution, and is removed by reacting with the etching solution, the part 211 of the first etch barrier layer 21 is covered by the second etching barrier layer 22 without reacting with the etching solution and is retained, and the second etching barrier layer 22 hardly reacts with the etching solution and is retained. By designing the material of the second etching barrier layer 22, the second etching barrier layer 22 can hardly react with the etching solution used to etch the first etching barrier layer 21, so that the second etching barrier layer 22 is retained.

Figure 5I:
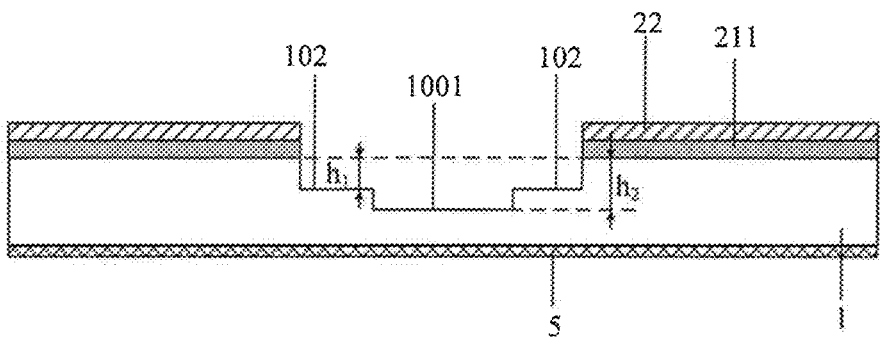

For example, during the subsequent etching process, the bottom surface formed before the subsequent etching process is further etched. As illustrated in FIG. 5I, the entirety consisting of the second etching barrier layer 22 and the part 211 of the first etching barrier layer 21 is used as the mask for performing the second etching process on the film 1 to form an recessed structure on the first surface 11, and the recessed structure includes a first bottom surface 102 having a first depth $h_1$ and a second bottom surface 1001 having a second depth $h_2$. During the second etching process, the initial bottom surface 101 formed in the first etching process is further etched so that the depth of the initial bottom surface 101 is increased, and thus $h_2$ is larger than $h_1$.

For example, during both the first etching process and the second etching process, the film 1 is etched by a wet etching method.

Other features and technical effects of the embodiment as illustrated in FIG. 5A-FIG. 5I are the same as those of the previous embodiment, please refer to the previous description.

FIG. 6A-FIG. 6I are schematic diagrams of further another patterning method of a film provided by an embodiment of the present disclosure. This embodiment has the following difference from the embodiment illustrated in FIG. 1A-FIG. 1M. Orthographic projections of the n etching barrier layers on the film 1 do not overlap with each other, and the n etching barrier layers include a previous etching barrier layer and a subsequent etching barrier layer. The previous etching barrier layer is a part of the n etching barrier layers which is removed after the previous etching process is completed, the subsequent etching barrier layer is a part of the n etching barrier layers which is removed after the subsequent etching process is completed, and a material of the previous etching barrier layer is different from a material of the subsequent etching barrier layer. For example, the n etching barrier layers are arranged in a second direction parallel to the film, two adjacent etching barrier layers of the n etching barrier layers are in contact with each other and include a previous etching barrier layer and a subsequent etching barrier layer, and the second direction is a direction from the previous etching barrier layer to the subsequent etching barrier layer. After the previous etching process is completed, the part of the n etching barrier layers which is removed is the previous etching barrier layer. In the present embodiment, the patterning method of a film is described by taking a case where n=2 as an example. Of course, in other embodiments, at least two of the n etching barrier layers may be spaced apart from each other, that is, not in contact with each other.

Exemplarily, after the steps illustrated in FIG. 1A-FIG. 1C are completed, the steps illustrated in FIG. 6A-FIG. 6I are performed.

Figure 6A:
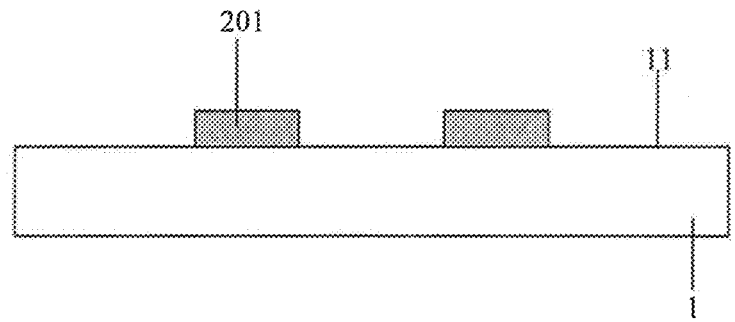
FIG. 6A-FIG. 6I are schematic diagrams of further another patterning method of a film provided by an embodiment of the present disclosure.

As illustrated in FIG. 6A, a first patterning process is performed on the first etching barrier material layer 210 using the first photoresist layer 41 (as illustrated in FIG. 1C) to form a first etching barrier layer 201, and the first photoresist layer 41 is removed. The first etching barrier layer 201 exposes a part of the film 1.

Figure 6B:
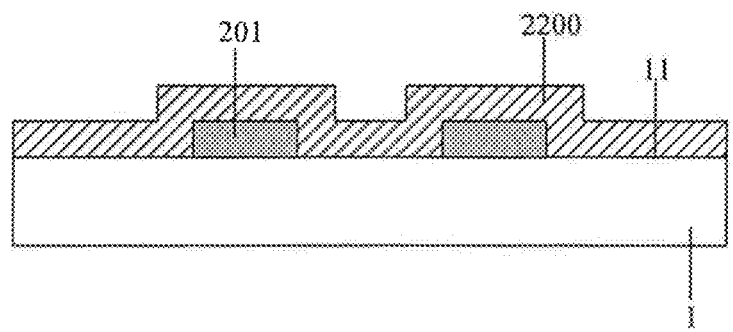

As illustrated in FIG. 6B, a second etching barrier material layer 2200 covering the first etching barrier layer 201 is formed on a side, away from the film 1, of the first etching barrier layer 201.

Figure 6C:
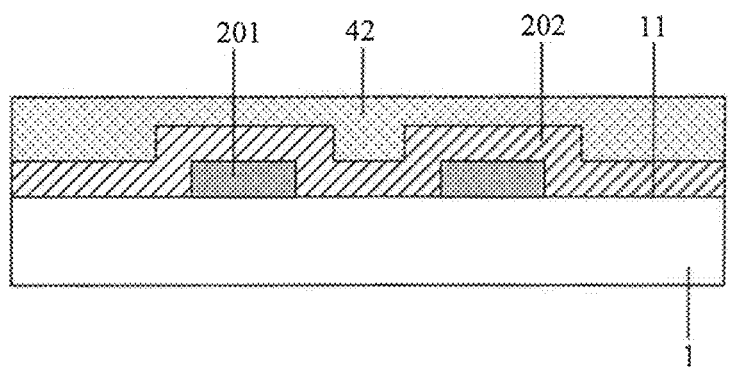

As illustrated in FIG. 6C, a second photoresist layer 42 is formed on the second etching barrier material layer 2200. For example, the second photoresist layer 42 is formed by a coating method.

Figure 6D:
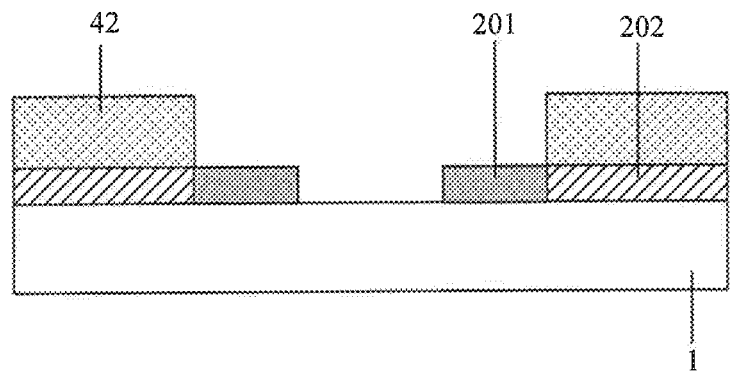

As illustrated in FIG. 6D, a photolithography process is performed on the second etching barrier material layer 2200 using the second photoresist layer 42 to form a second etching barrier layer 202.

Figure 6E:
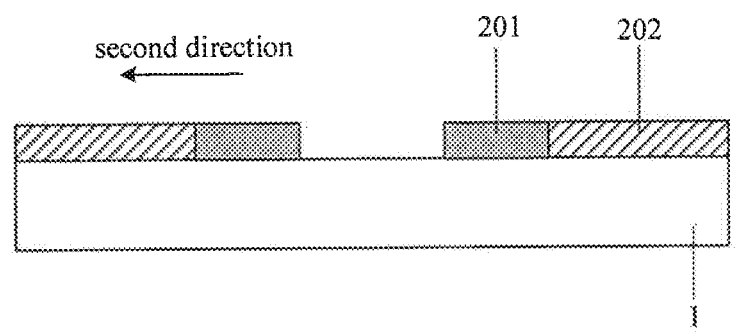

As illustrated in FIG. 6E, the second photoresist layer 42 is removed.

In the present embodiment, orthographic projections of the two etching barrier layers on the film 1 do not overlap with each other. The two etching barrier layers are arranged in a second direction (a direction of the arrow in FIG. 6E) parallel to the film; the first etching barrier layer 201 and the second etching barrier layer 202 are two adjacent etching barrier layers, for example, the two adjacent etching barrier layers are in contact with each other, the first etching barrier layer 201 is the previous etching barrier layer, and the second etching barrier layer 202 is the subsequent etching barrier layer. During the two adjacent etching processes, the first etching process is the previous etching process, and the second etching process is the subsequent etching process. The second direction is a direction from the previous etching barrier layer to the subsequent etching barrier layer. For example, in other embodiments, there may be an interval between two adjacent etching barrier layers, that is, the two adjacent etching barrier layers are not in contact with each other. Those skilled in the art can design the positions of the n etching barrier layers according to the required pattern of the recessed structure.

Figure 6F:
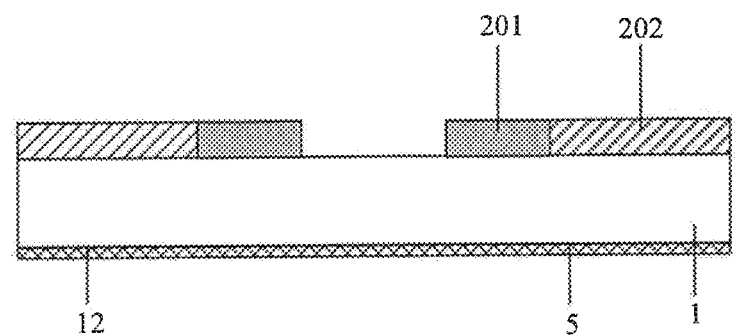

As illustrated in FIG. 6F, an anti-etching film 5 covering the second surface 12 of the film 1 is formed before performing an etching process on the film 1, and the second surface 12 is opposite to the first surface 11. Thus, the second surface 12 of the film 1 that does not need to be etched can be protected, and the second surface 12 can be prevented from being etched in the subsequent etching process.

Figure 6G:
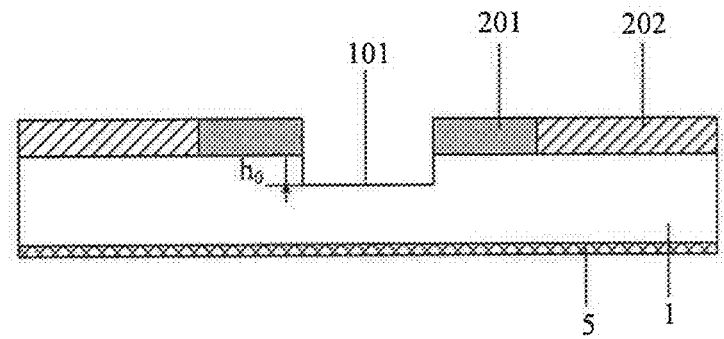

As illustrated in FIG. 6G, a first etching process is performed on the film 1, using an entirety consisting of the first etching barrier layer 201 and the second etching barrier layer 202 as a mask, to form an initial recessed structure on the first surface 11, and the initial recessed structure includes an initial bottom surface 101 having an initial depth $h_0$.

Figure 6H:
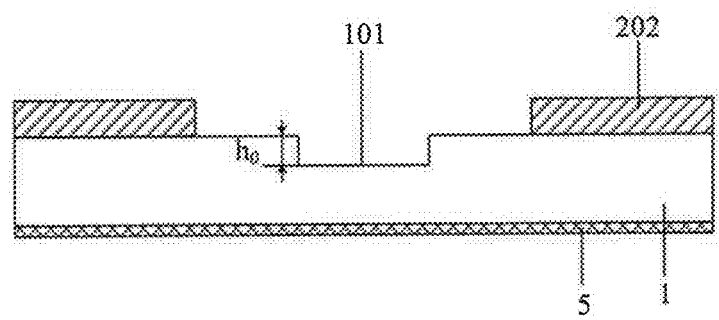

As illustrated in FIG. 6H, after the first etching process is completed, a part of the two etching barrier layers is removed to form a mask for a second etching process. After the previous etching process is completed, the part of the two etching barrier layers which is removed is the first etching barrier layer 201 (that is, the previous etching barrier layer). Thus, the second etching barrier layer 202 is the mask for the second etching process (the subsequent etching process of the two adjacent etching processes), and the second etching barrier layer 202 is the subsequent etching barrier layer. For example, a material of the first etching barrier layer 201 is different from a material of the second etching barrier layer 202, so that the material of the part, which is removed, of the first etching barrier layer 201 is different from the material of the mask for the second etching process. For example, the first etching barrier layer 201 is removed by a wet etching method. For example, in the etching solution used in the process of removing the first etching barrier layer 201 by a wet etching method, etching selectivity of the material of the first etching barrier layer 201 is different from etching selectivity of the material of the second etching barrier layer 202, for example, a ratio of the etching selectivity of the material of the first etching barrier layer 201 to the etching selectivity of the material of the second etching barrier layer 202 is larger than or equal to 100. Thus, the first etching barrier layer 201 is removed by reacting with the etching solution, and the second etching barrier layer 202 hardly reacts with the etching solution and is retained.

Figure 6I:
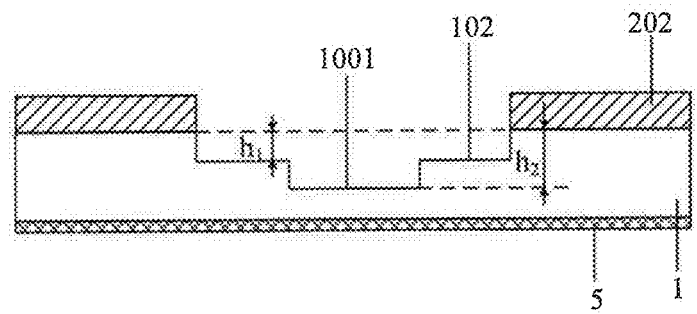

For example, during the subsequent etching process, the bottom surface formed before the subsequent etching process is further etched. As illustrated in FIG. 6I, the second etching barrier layer 202 is used as a mask to perform a second etching process on the film 1 to form an recessed structure on the first surface 11, and the recessed structure includes a first bottom surface 102 having a first depth $h_1$ and a second bottom surface 1001 having a second depth $h_2$. During the second etching process and during the subsequent etching process, the initial bottom surface 101 formed in the first etching process is further etched, so that the depth of the initial bottom surface 101 to be increased, and thus $h_2$ is larger than $h_1$.

For example, during both the first etching process and the second etching process, the film 1 is etched by a wet etching method.

Other features and technical effects of the embodiment as illustrated in FIG. 6A-FIG. 6I are the same as those of the previous embodiment, please refer to the previous description.

In a case where n is another integer larger than or equal to 2, the idea of the patterning method is the same as that in the above embodiment, and the patterning method in these cases can be clearly obtained according to the above embodiment.

Each of the n etching barrier layers in the embodiment of the present disclosure may be a continuous structure, or may include a plurality of parts spaced apart from each other. Those skilled in the art can design according to the required pattern of the recessed structure.

It should be noted that, the patterning method of a film provided in the present disclosure includes a patterning method of a film obtained by combining a plurality of the patterning methods of a film provided in the embodiments of the present disclosure.

At least one embodiment of the present disclosure further provides a manufacturing method of a microfluidic device, and the manufacturing method includes forming a film using any patterning method of a film provided by the embodiment of the present disclosure. For example, the film may be implemented by any one or any combination of the patterning methods as illustrated in FIG. 1A-FIG. 1M, FIG. 2A-FIG. 2I, FIG. 3A-FIG. 3I, FIG. 4A-FIG. 4J, FIG. 5A-FIG. 5I, and FIG. 6A-FIG. 6I. Of course, the first film may also be other film, and the shape of the recessed structure may be designed as required.

Figure 7A:
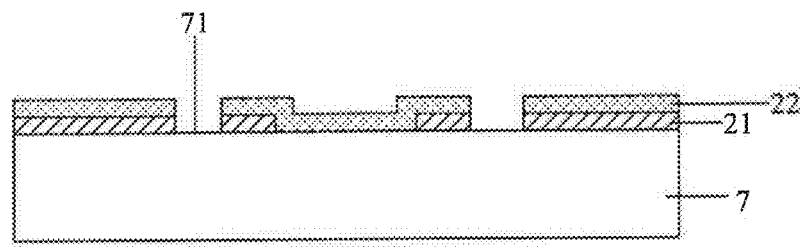
FIG. 7A-FIG. 7F are schematic diagrams of a manufacturing method of a microfluidic device provided by the present disclosure.
Figure 7B:
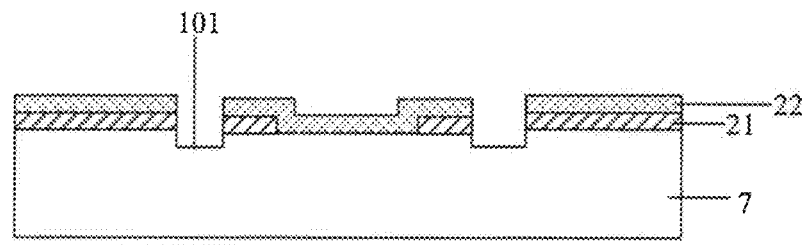
Figure 7C:
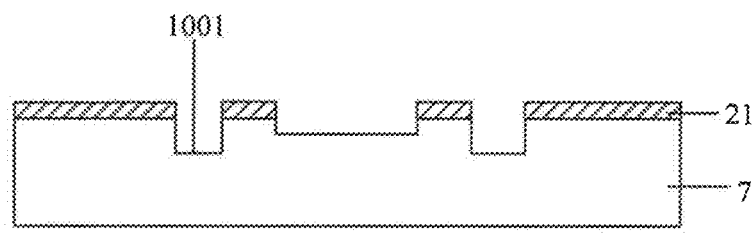
Figure 7D:
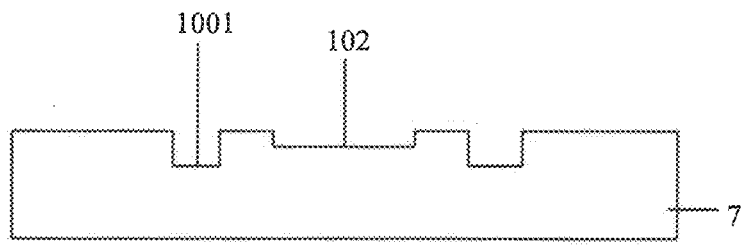

Exemplarily, FIG. 7A-FIG. 7F are schematic diagrams of a manufacturing method of a microfluidic device provided by the present disclosure. As illustrated in FIG. 7A-FIG. 7F, the first film is formed by using the method provided in the embodiment of the present disclosure. As illustrated in FIG. 7A, a first film 7 is provided, and the first film 7 includes a first surface 71. A first etching barrier layer 21 and a second etching barrier layer 22, which are stacked, are formed on the first surface 71 of the first film 7 in sequence. As illustrated in FIG. 7B, a first etching process is performed on the first film 7 using an entirety consisting of the first etching barrier layer 21 and the second etching barrier layer 22 as a mask to form an initial recessed structure, and the initial recessed structure includes an initial bottom surface 101 having an initial depth. As illustrated in FIG. 7C, the second etching barrier layer 22 is removed, a second etching process is performed on the first film 7 using the first etching barrier layer 21 as a mask to form a recessed structure, the recessed structure includes a first bottom surface 1001 having a first depth and a second bottom surface 102 having a second depth, and the second depth is less than the first depth. As illustrated in FIG. 7D, the first etching barrier layer 21 is removed to obtain the first film 7 for the microfluidic device.

Figure 7E:
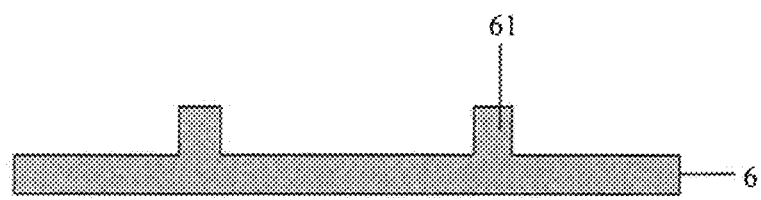

The manufacturing method of the microfluidic device provided by an embodiment of the present disclosure further includes providing a second film 6 as illustrated in FIG. 7E, and the second film 6 includes a protrusion 61.

Figure 7F:
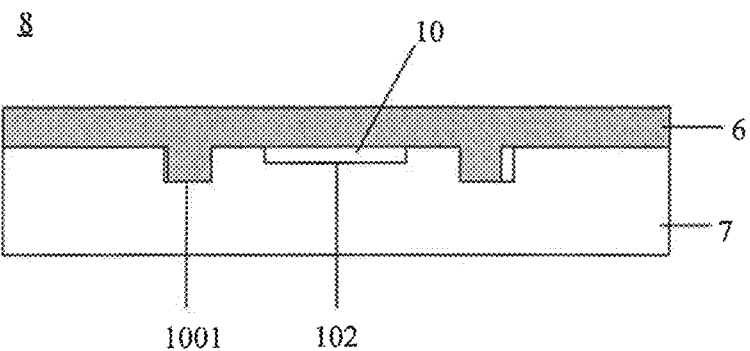

As illustrated in FIG. 7F, the manufacturing method of the microfluidic device further includes bonding the first film 7 and the second film 6, the first film 7 is opposite to the second film 6, so that the protrusion 61 is bonded with and in contact with the first bottom surface 1001 of the first film 7 to form a cavity 10 between the second bottom surface 102 of the first film 7 and the second film 6. The cavity 10 has a specific cross-sectional shape (which can be designed according to specific needs). A surface, facing the first film 7, of the protrusion 61 is bonded with and in contact with the recessed structure on the first surface 71 of the first film 7 to seal the cavity 10 on both sides of the cavity 10. Therefore, liquid can flow in the cavity 10, for example, the cavity 10 is used to monitor a flow amount of the liquid. For example, the size of the cavity 10 is in the order of 100 micrometers (for example, 100-500 μm). The manufacturing method of the microfluidic device provided by the embodiment of the present disclosure can achieve a higher dimensional accuracy with a simpler process.

Figure 8A:
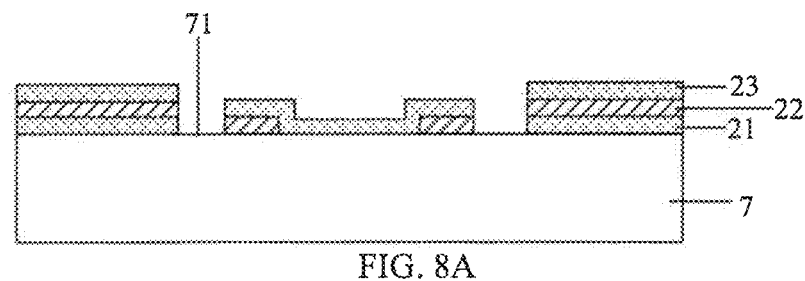
FIG. 8A-FIG. 8G are schematic diagrams of another manufacturing method of a microfluidic device provided by the present disclosure.
Figure 8B:
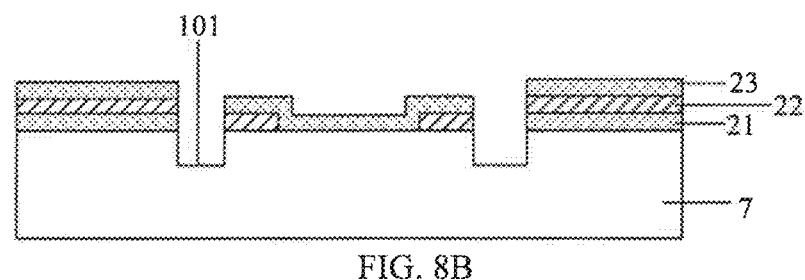
Figure 8C:
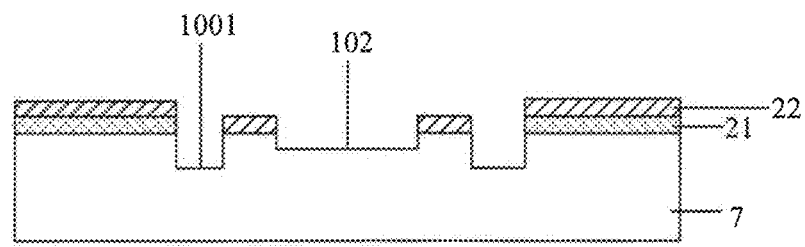
Figure 8D:
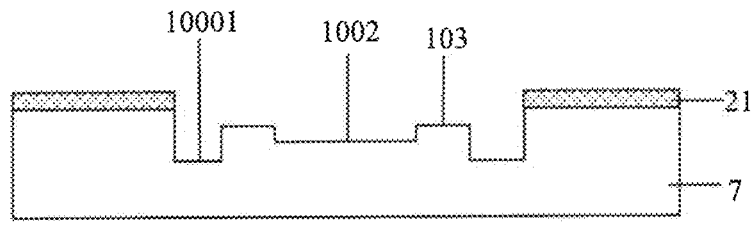
Figure 8E:
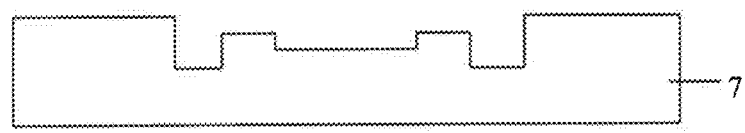

Those skilled in the art can design the n etching barrier layers according to the shape of the cavity to be formed. For example, FIG. 8A-FIG. 8G are schematic diagrams of another manufacturing method of a microfluidic device provided by the present disclosure. As illustrated in FIG. 8A-FIG. 8F, the first film is formed by using the method provided in the embodiment of the present disclosure. As illustrated in FIG. 8A, a first film 7 is provided, and the first film 7 includes a first surface 71. A first etching barrier layer 21, a second etching barrier layer 22 and a third etching barrier layer 23, that are stacked, are formed on the first surface 71 of the first film 7 in sequence. For example, the first etching barrier layer 21, each selected of a group consisting of the second etching barrier layer 22, and the third etching barrier layer 23 includes a plurality of parts spaced apart from each other. As illustrated in FIG. 8B, a first etching process is performed on the first film 7 using an entirety consisting of the first etching barrier layer 21, the second etching barrier layer 22 and the third etching barrier layer 23 as a mask to form a first initial recessed structure; the first initial recessed structure includes a first initial bottom surface 101 having a first initial depth. As illustrated in FIG. 8C, the third etching barrier layer 23 is removed, a second etching process is performed on the first film 7 using an entirety consisting of the first etching barrier layer 21 and the second etching barrier layer 22 as a mask to form a second initial recessed structure, the second initial recessed structure includes a second initial bottom surface 102 having a second initial depth and a third initial bottom surface 1001 having a third initial depth, and the second initial depth is less than the third initial depth. As illustrated in FIG. 8D, the second etching barrier layer 22 is removed, a third etching process is performed on the first film 7 using the first etching barrier layer 21 as a mask to form a recessed structure, the recessed structure includes a first bottom surface 10001 having a first depth, a second bottom surface 1002 having a second depth and a third bottom surface 103 having a third depth. As illustrated in FIG. 8E, the first etching barrier layer 21 is removed to obtain the first film 7 for the microfluidic device.

Figure 8F:
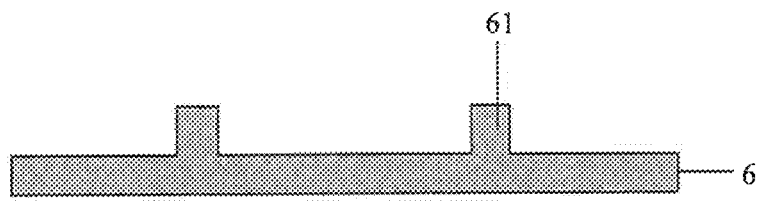

The manufacturing method of the microfluidic device provided by an embodiment of the present disclosure further includes providing a second film 6 as illustrated in FIG. 8F, and the second film 6 includes a protrusion 61.

Figure 8G:
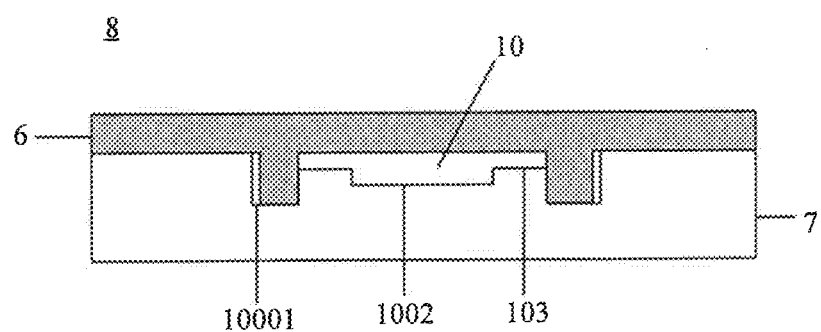

As illustrated in FIG. 8G, the manufacturing method of the microfluidic device further includes bonding the first film 7 and the second film 6, the first film 7 is opposite to the second film 6, so that the protrusion 61 is bonded with and in contact with the first bottom surface of the first film 7 to form a cavity 10 between the second bottom surface 1002 of the first film 7, the third bottom surface 103 of the first film 7 and the second film 6. The cavity 10 has a specific cross-sectional shape (which can be designed according to specific needs). A surface, facing the first film 7, of the protrusion 61 is bonded with and in contact with the first bottom surface 10001 of the recessed structure on the first surface 71 of the first film 7 to seal the cavity 10 on both sides of the cavity 10.

At least one embodiment of the present disclosure further provides a microfluidic device manufactured by using the manufacturing method of a microfluidic device provided by the embodiment of the present disclosure. The microfluidic device includes a first film including a first surface, a recessed structure is on the first surface of the first film, the recessed structure includes a first bottom surface having a first depth and a second bottom surface having a second depth, and the second depth is less than the first depth; and a second film including a protrusion, the protrusion is opposite to the first bottom surface of the first film to form a cavity between the second bottom surface of the first film and the second film. The microfluidic device includes a film formed by using any patterning method of a film provided by the embodiment of the present disclosure. For example, the microfluidic device further includes a channel for passing liquid into the cavity 10, and a flow monitoring device for monitoring a flow amount of the liquid in the cavity 10. Other structures of the microfluidic device are not limited, and those skilled in the art can design according to requirements.

What have been described above are only specific implementations of the present disclosure, the protection scope of the present disclosure is not limited thereto, and the protection scope of the present disclosure should be based on the protection scope of the claims.

What is claimed is:

1. A patterning method of a film, comprising:
   providing a film comprising a first surface;
   forming n etching barrier layers on the first surface of the film, wherein n is an integer larger than or equal to 2; and
   performing n etching processes on the film to form a recessed structure on the first surface using the n etching barrier layers as masks, wherein the recessed structure comprises n kinds of bottom surfaces respectively having n kinds of depths different from each other, each of the depths is a distance from a respective bottom surface of the n bottom surfaces to the first surface in a direction perpendicular to the film, wherein
   two adjacent etching processes of the n etching processes comprise a previous etching process and a subsequent etching process, and after the previous etching process is completed, a part of the n etching barrier layers is removed to form a mask for the subsequent etching process;
   after the previous etching process is completed, a material of the part of the n etching barrier layers which is removed is at least partially different from a material of the mask of the subsequent etching process;
   the n etching barrier layers comprise two adjacent etching barrier layers, the two adjacent etching barrier layers are stacked and comprise an etching barrier layer close to the film and an etching barrier layer away from the film,
   an orthographic projection of a part of the etching barrier layer away from the film on the film overlaps with the an orthographic projection of the etching barrier layer close to the film on the film, and an orthographic projection of another part of the etching barrier layer away from the film on the film does not overlap with the orthographic projection of the etching barrier layer close to the film on the film;
   the part of the n etching barrier layers which is removed after the previous etching process is completed is the etching barrier layer away from the film;
   the etching barrier layer close to the film comprises a first upper part covering the first surface of the film and a first side part covering an outer side surface of the film, the outer side surface of the film is on an outer edge, away from the recessed structure, of the film and intersects with the first surface; and
   the etching barrier layer away from the film comprises a second upper part covering an upper surface, away from the film, of the first upper part and comprises a second side part covering an outer side surface of the first side part, and the outer side surface of the first side part intersects with the upper surface of the first upper part.

2. The patterning method of the film according to claim 1, wherein materials of the two adjacent etching barrier layers of the n etching barrier layers are different from each other.

3. The patterning method of the film according to claim 1, wherein materials of the n etching barrier layers are all different from each other.

4. The patterning method of the film according to claim 1, wherein during the subsequent etching process, the bottom surface formed before the subsequent etching process is further etched.

5. The patterning method of the film according to claim 4, wherein a cross-sectional shape of the recessed structure in the direction perpendicular to the film comprises a stepped shape.

6. The patterning method of the film according to claim 1, wherein in the n etching processes, the film is etched by a wet etching method.

7. The patterning method of the film according to claim 1, wherein a material of each of the n etching barrier layers comprises metal or metal oxide.

8. The patterning method of the film according to claim 1, wherein after the previous etching is completed, a wet etching method is used to remove the part of the n etching barrier layers.

9. The patterning method of the film according to claim 1, wherein forming the n etching barrier layers comprises:
   forming a first etching barrier material layer covering the film on the film, and performing a first patterning process on the first etching barrier material layer to form a first etching barrier layer; and
   forming an nth etching barrier material layer covering an (n−1)th etching barrier layer on a side, away from the film, of the (n−1)th etching barrier layer, and performing an nth patterning process on the nth etching barrier material layer to form an nth etching barrier layer.

10. The patterning method of the film according to claim 1, wherein forming each of the n etching barrier layers comprises:
    forming an etching barrier material layer;
    forming a photoresist layer on the etching barrier material layer;
    performing a photolithography process on the etching barrier material layer using the photoresist layer to form the respective etching barrier layer of the n etching barrier layers; and
    removing the photoresist layer.

11. The patterning method of the film according to claim 1, further comprising:
    before performing the n etching processes on the film, forming an anti-etching film covering a second surface of the film, wherein the second surface is opposite to the first surface.

12. The patterning method of the film according to claim 1, wherein the film is a glass substrate.

13. A manufacturing method of a microfluidic device, comprising:
    providing a first film, wherein the first film comprises a first surface;
    forming a recessed structure on the first surface of the first film by the patterning method of the film according to claim 1, wherein the recessed structure comprises a first bottom surface having a first depth and a second bottom surface having a second depth, and the second depth is less than the first depth;

providing a second film, wherein the second film comprises a protrusion; and bonding the first film and the second film, the first film being opposite to the second film, so that the protrusion is bonded with and in contact with the first bottom surface of the first film to form a cavity between the second bottom surface of the first film and the second film.

14. The patterning method of the film according to claim 1, wherein the n etching barrier layers are stacked in the direction perpendicular to the film.

* * * * *